(12) United States Patent
Hopkins et al.

(10) Patent No.: US 11,910,606 B2
(45) Date of Patent: Feb. 20, 2024

(54) INTEGRATED ASSEMBLIES COMPRISING CONDUCTIVE LEVELS HAVING TWO DIFFERENT METAL-CONTAINING STRUCTURES LATERALLY ADJACENT ONE ANOTHER, AND METHODS OF FORMING INTEGRATED ASSEMBLIES

(71) Applicant: Micron Technology, Inc., Boise, ID (US)

(72) Inventors: John D. Hopkins, Meridian, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 90 days.

(21) Appl. No.: 17/692,041

(22) Filed: Mar. 10, 2022

(65) Prior Publication Data

US 2022/0199646 A1 Jun. 23, 2022

Related U.S. Application Data

(62) Division of application No. 16/585,418, filed on Sep. 27, 2019, now Pat. No. 11,302,707.

(51) Int. Cl.
*H10B 41/35* (2023.01)
*H10B 43/27* (2023.01)
(Continued)

(52) U.S. Cl.
CPC ......... *H10B 43/27* (2023.02); *H01L 21/0217* (2013.01); *H01L 21/02164* (2013.01); *H01L 21/02532* (2013.01); *H01L 21/02636* (2013.01); *H01L 21/31111* (2013.01); *H01L 23/528* (2013.01); *H01L 23/53266* (2013.01); *H01L 29/40114* (2019.08); *H01L 29/40117* (2019.08); *H10B 41/10* (2023.02); *H10B 41/27* (2023.02); *H10B 43/10* (2023.02)

(58) Field of Classification Search
None
See application file for complete search history.

(56) References Cited

U.S. PATENT DOCUMENTS

| | | | |
|---|---|---|---|
| 2015/0179662 A1* | 6/2015 | Makala | H01L 29/40114 257/314 |
| 2018/0090373 A1 | 3/2018 | Sharangpani et al. | |

(Continued)

*Primary Examiner* — Joseph C. Nicely
*Assistant Examiner* — Lamont B Koo
(74) *Attorney, Agent, or Firm* — Wells St. John P.S.

(57) ABSTRACT

Some embodiments include a memory device having a vertical stack of alternating insulative levels and conductive levels. The conductive levels include first regions, and include second regions laterally adjacent to the first regions. The first regions have a first vertical thickness and at least two different metal-containing materials along the first vertical thickness. The second regions have a second vertical thickness at least as large as the first vertical thickness, and have only a single metal-containing material along the second vertical thickness. Dielectric-barrier material is laterally adjacent to the first regions. Charge-blocking material is laterally adjacent to the dielectric-barrier material. Charge-storage material is laterally adjacent to the charge-blocking material. Dielectric material is laterally adjacent to the charge storage material. Channel material is laterally adjacent to the dielectric material.

17 Claims, 27 Drawing Sheets

(51) Int. Cl.
*H01L 23/528* (2006.01)
*H01L 23/532* (2006.01)
*H01L 21/02* (2006.01)
*H01L 21/311* (2006.01)
*H01L 21/28* (2006.01)
*H10B 41/10* (2023.01)
*H10B 41/27* (2023.01)
*H10B 43/10* (2023.01)

(56) References Cited

U.S. PATENT DOCUMENTS

| | | |
|---|---|---|
| 2018/0219021 A1 | 8/2018 | Daycock et al. |
| 2020/0402993 A1 | 12/2020 | Hopkins et al. |
| 2021/0050361 A1 | 2/2021 | Hopkins et al. |

* cited by examiner

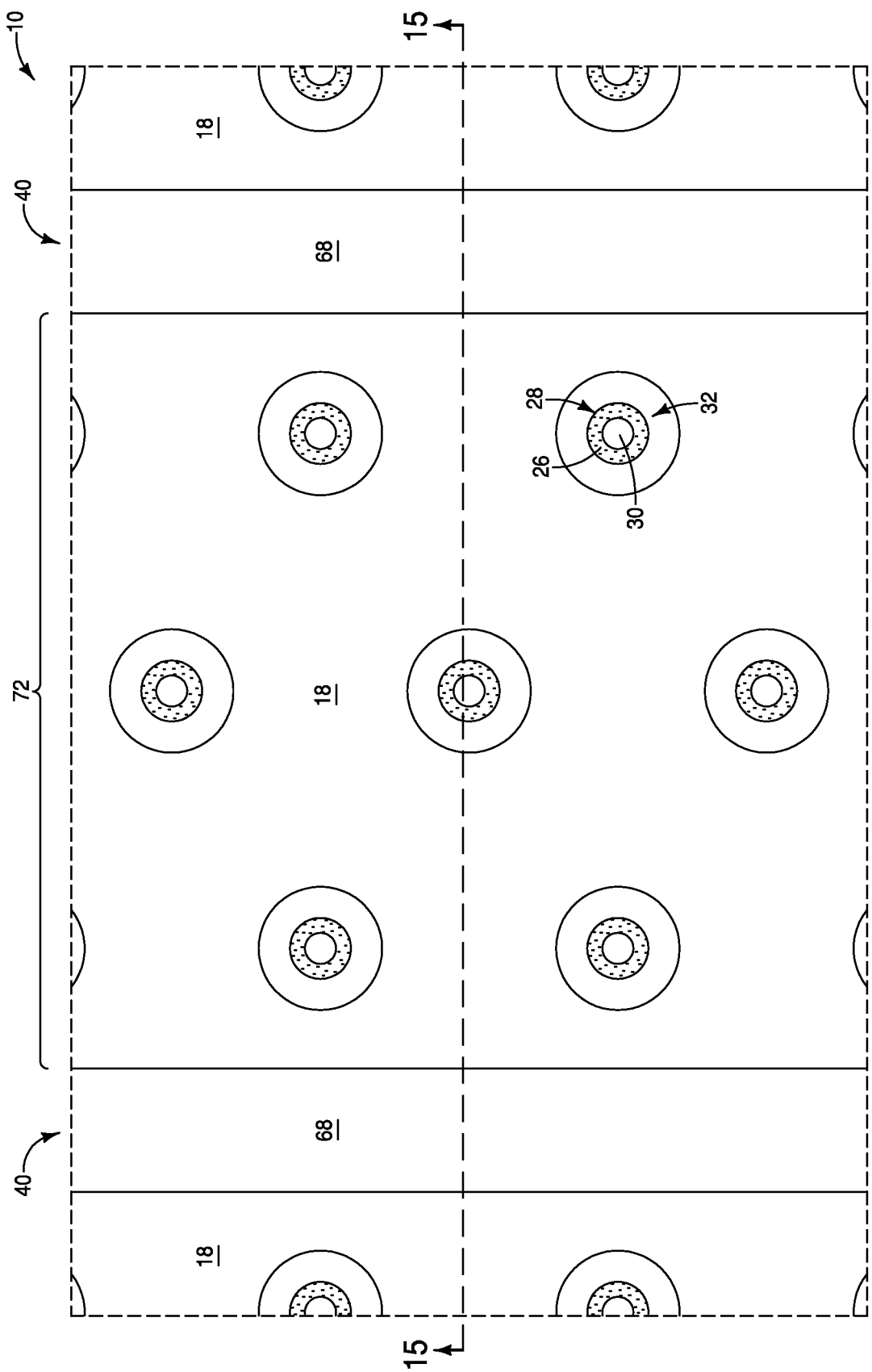

INTEGRATED ASSEMBLIES COMPRISING CONDUCTIVE LEVELS HAVING TWO DIFFERENT METAL-CONTAINING STRUCTURES LATERALLY ADJACENT ONE ANOTHER, AND METHODS OF FORMING INTEGRATED ASSEMBLIES

RELATED PATENT DATA

This patent resulted from a divisional of U.S. patent application Ser. No. 16/585,418 filed Sep. 27, 2019 which is hereby incorporated by reference herein.

TECHNICAL FIELD

Integrated assemblies (e.g., memory devices). Methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals AO through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the AO through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" (sub-block) of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved memory devices (e.g., NAND architectures), and to develop methods for fabricating the improved memory devices.

BRIEF DESCRIPTION OF THE DRAWINGS

FIG. 15B is a diagrammatic top-down view along the line 15B-15B of FIG. 15. The view of FIG. 15 is along the line 15-15 of FIG. 15B.

DETAILED DESCRIPTION OF THE ILLUSTRATED EMBODIMENTS

Some embodiments include memory devices (e.g., NAND memory arrays) having conductive levels with two different conductive structures that are laterally adjacent to one another. A first of the conductive structures is proximate a channel material and includes a conductive liner along outer surfaces of a conductive core. A second of the conductive structures is distal from the channel material and comprises a single conductive material throughout an entirety of its vertical thickness. The first of the conductive structures may be comprised by control gates of memory cells, and the second of the conductive structures may be comprised by wordlines (routing structures) between the memory cells. Example embodiments are described with reference to FIGS. 5-24.

Figure 1:
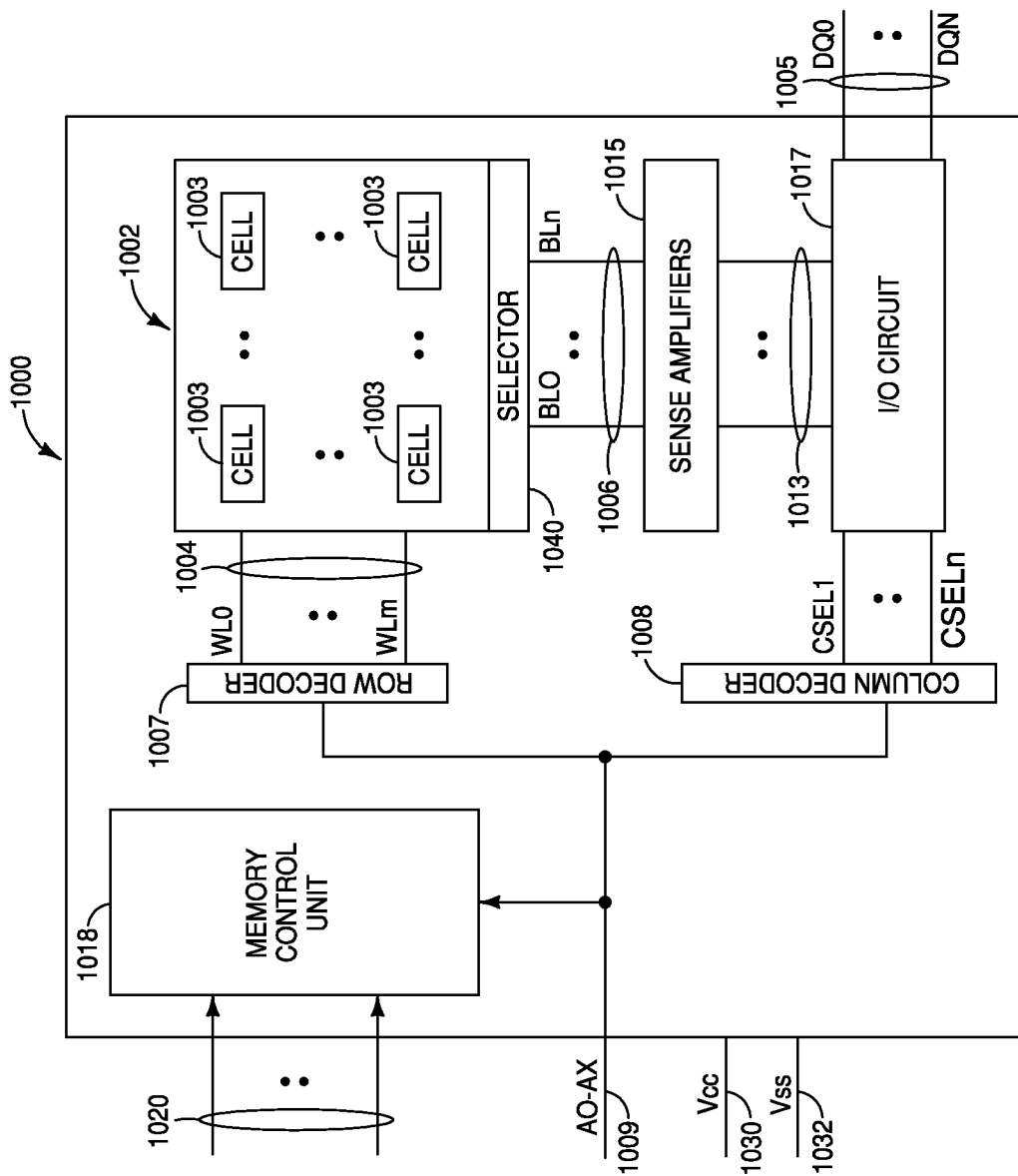
FIG. 1 shows a block diagram of a prior art memory device having a memory array with memory cells.
Figure 2:
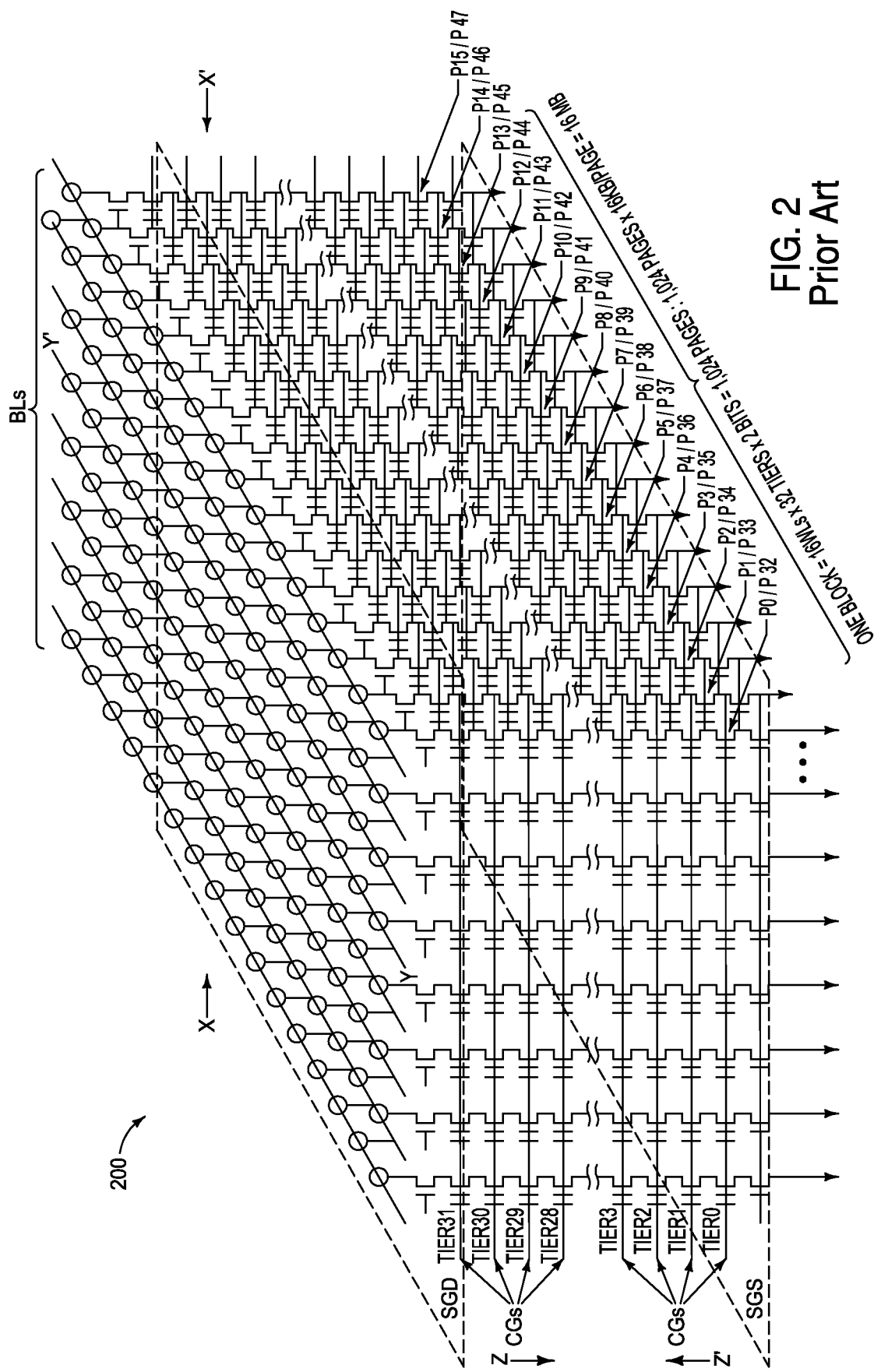
FIG. 2 shows a schematic diagram of the prior art memory array of FIG. 1 in the form of a 3D NAND memory device.
Figure 3:
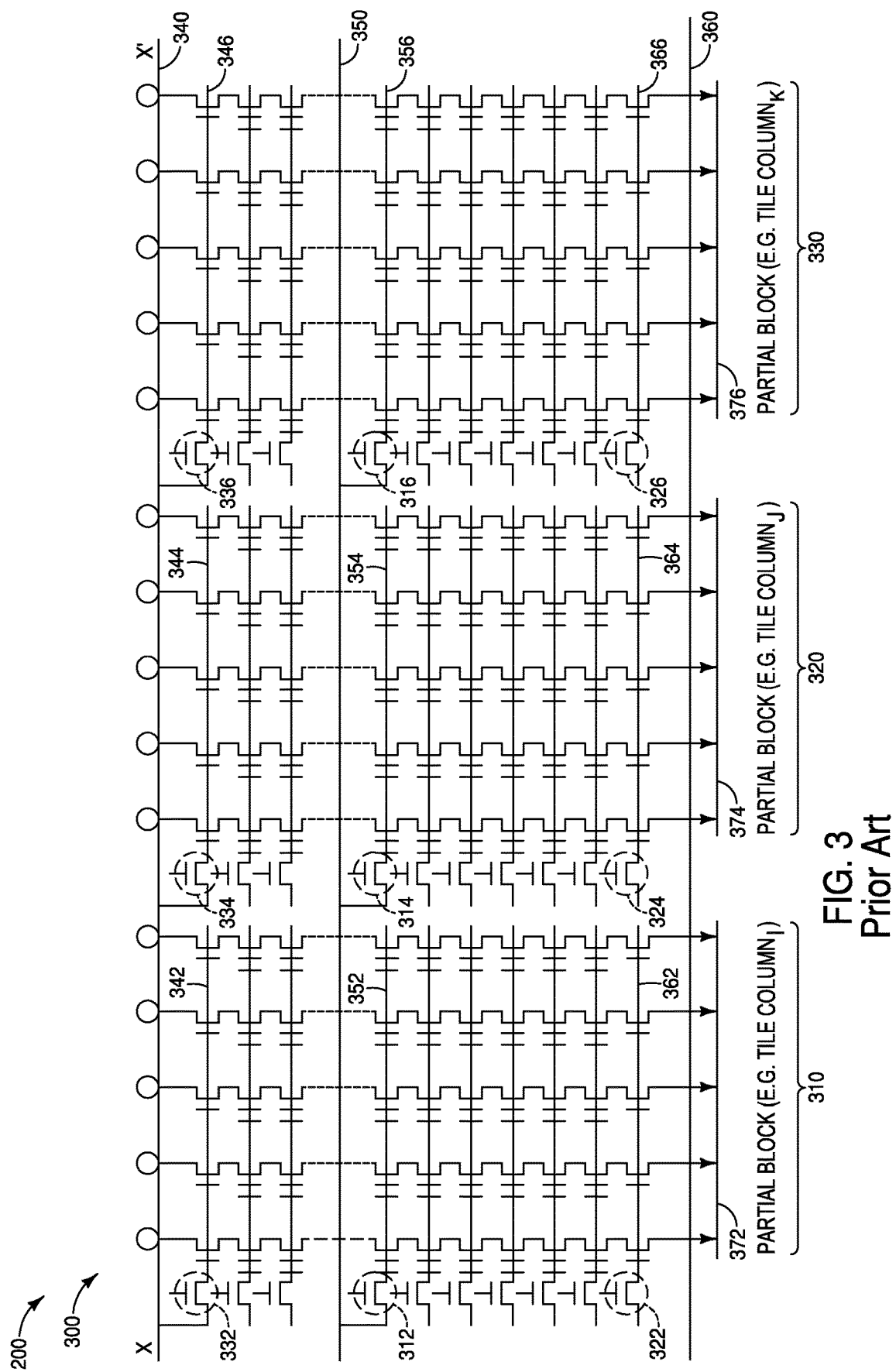
FIG. 3 shows a cross-sectional view of the prior art 3D NAND memory device of FIG. 2 in an X-X' direction.
Figure 4:
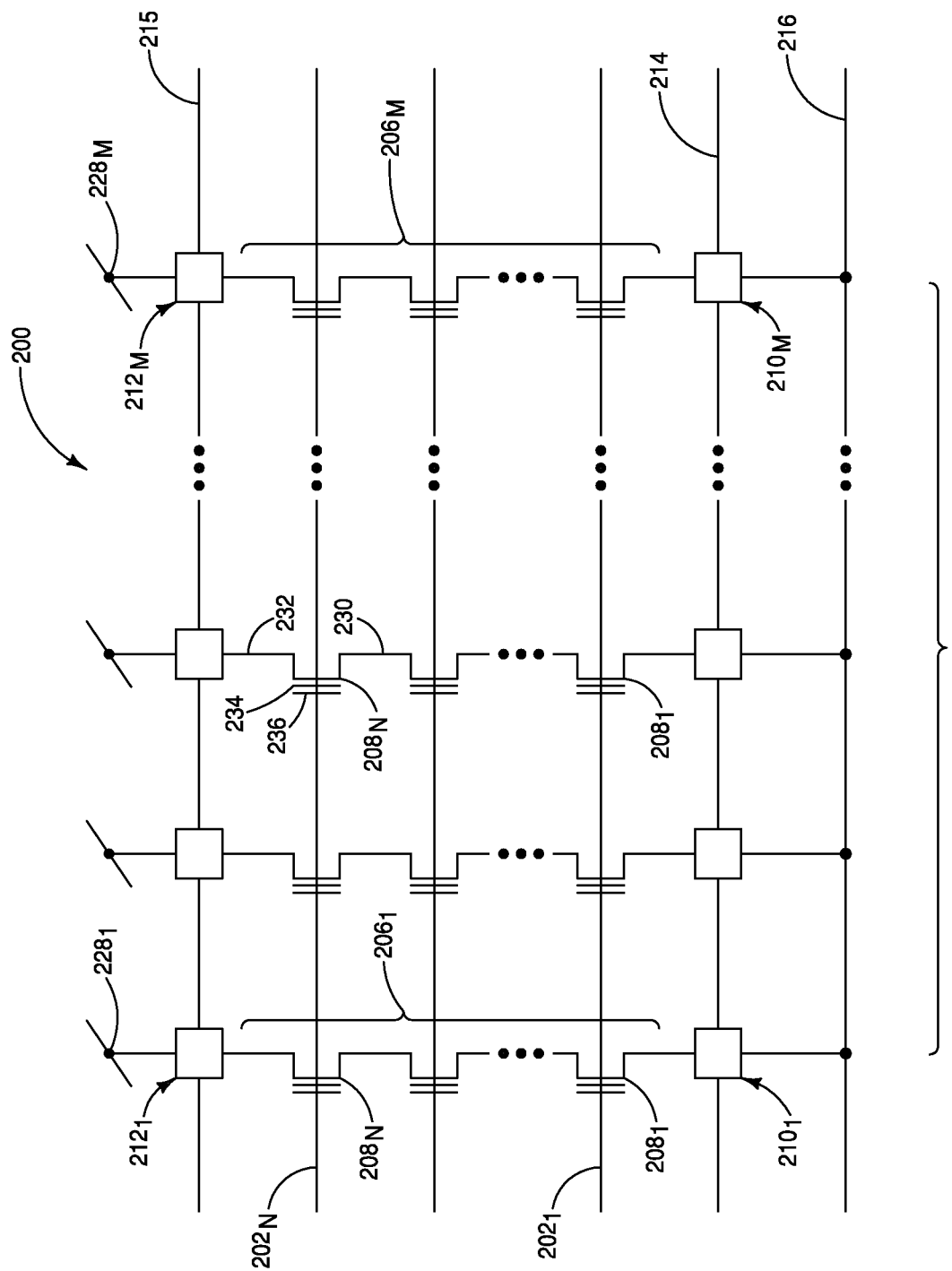
FIG. 4 is a schematic diagram of a prior art NAND memory array.
Figure 5:
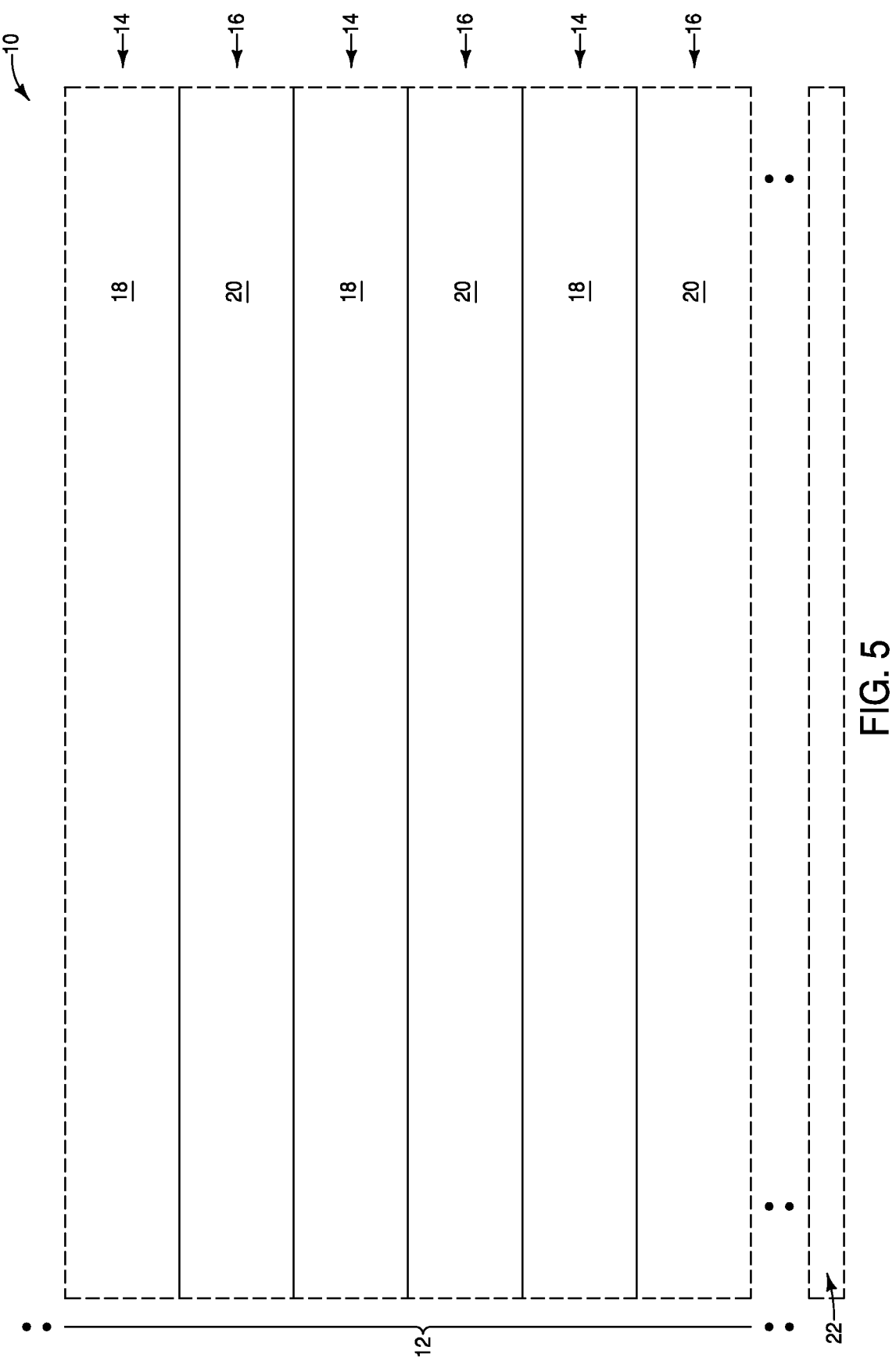
FIG. 5 is a diagrammatic cross-sectional side view of a region of an example integrated assembly showing an example process stage of an example method for fabricating an example memory device.

Referring to FIG. 5, a construction (i.e., assembly, architecture, etc.) 10 includes a stack 12 of alternating first and second levels 14 and 16. The first levels 14 comprise first material 18, and the second levels 16 comprise second material 20. The second material 20 may be sacrificial material (e.g., silicon nitride), and the first material 18 may be insulative material (e.g., silicon dioxide).

The levels 14 and 16 may be of any suitable thicknesses; and may be the same thickness as one another, or different thicknesses relative to one another. In some embodiments, the levels 14 and 16 may have vertical thicknesses within a range of from about 10 nanometers (nm) to about 400 nm.

The sacrificial material 20 of the second levels 16 may be replaced with conductive material of memory cell gates (as discussed below). Accordingly, the levels 16 may ultimately correspond to memory cell levels of a NAND configuration. The NAND configuration will include strings of memory cells (i.e., NAND strings), with the number of memory cells in the strings being determined by the number of vertically-stacked levels 16. The NAND strings may comprise any suitable number of memory cell levels. For instance, the NAND strings may have 8 memory cell levels, 16 and memory cell levels, 32 memory cell levels, 64 memory cell levels, 512 memory cell levels, 1024 memory cell levels, etc. The vertical stack 12 is shown to extend outwardly beyond the illustrated region of the stack to indicate that there may be more vertically-stacked levels than those specifically illustrated in the diagram of FIG. 5.

The stack 12 is shown to be supported over a base 22. The base 22 may comprise semiconductor material; and may, for example, comprise, consist essentially of, or consist of monocrystalline silicon. The base 22 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 22 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 12 and the base 22 to indicate that other components and materials may be provided between the stack 12 and the base 22. Such other components and materials may comprise additional levels of the stack, a source line level, source-side select gates (SGSs), etc.

Figure 6:
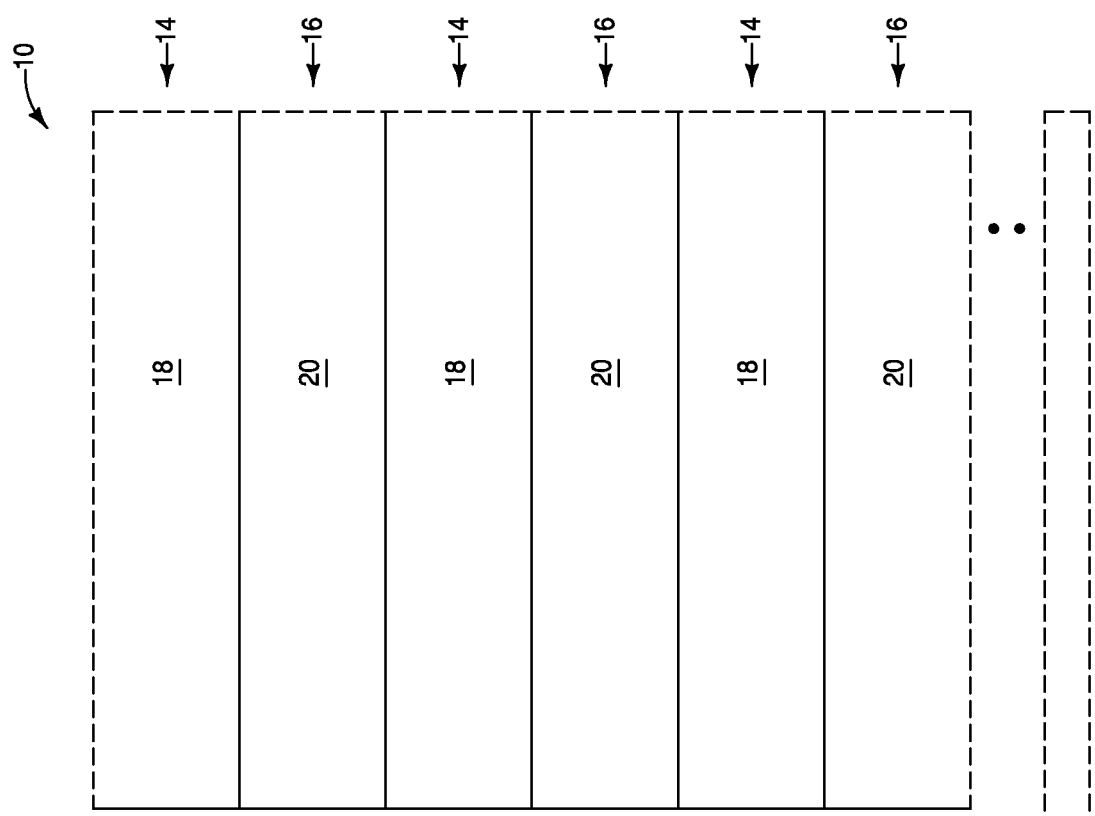
FIG. 6 is a diagrammatic cross-sectional side view of the region of the example integrated assembly of FIG. 5 at an example process stage following the process stage of FIG. 5.

Referring to FIG. 6, an opening 24 is formed through the stack 12. The opening is ultimately utilized for fabricating channel material pillars associated with vertically-stacked memory cells of a memory array, and in some embodiments may be referred to as a pillar opening. The opening 24 may have any suitable configuration when viewed from above; and in some example embodiments may be circular, elliptical, polygonal, etc. The opening 24 may be representative of a large number of substantially identical openings formed to extend through the stack 12; with the term "substantially identical" meaning identical to within reasonable tolerances of fabrication and measurement.

Figure 7:
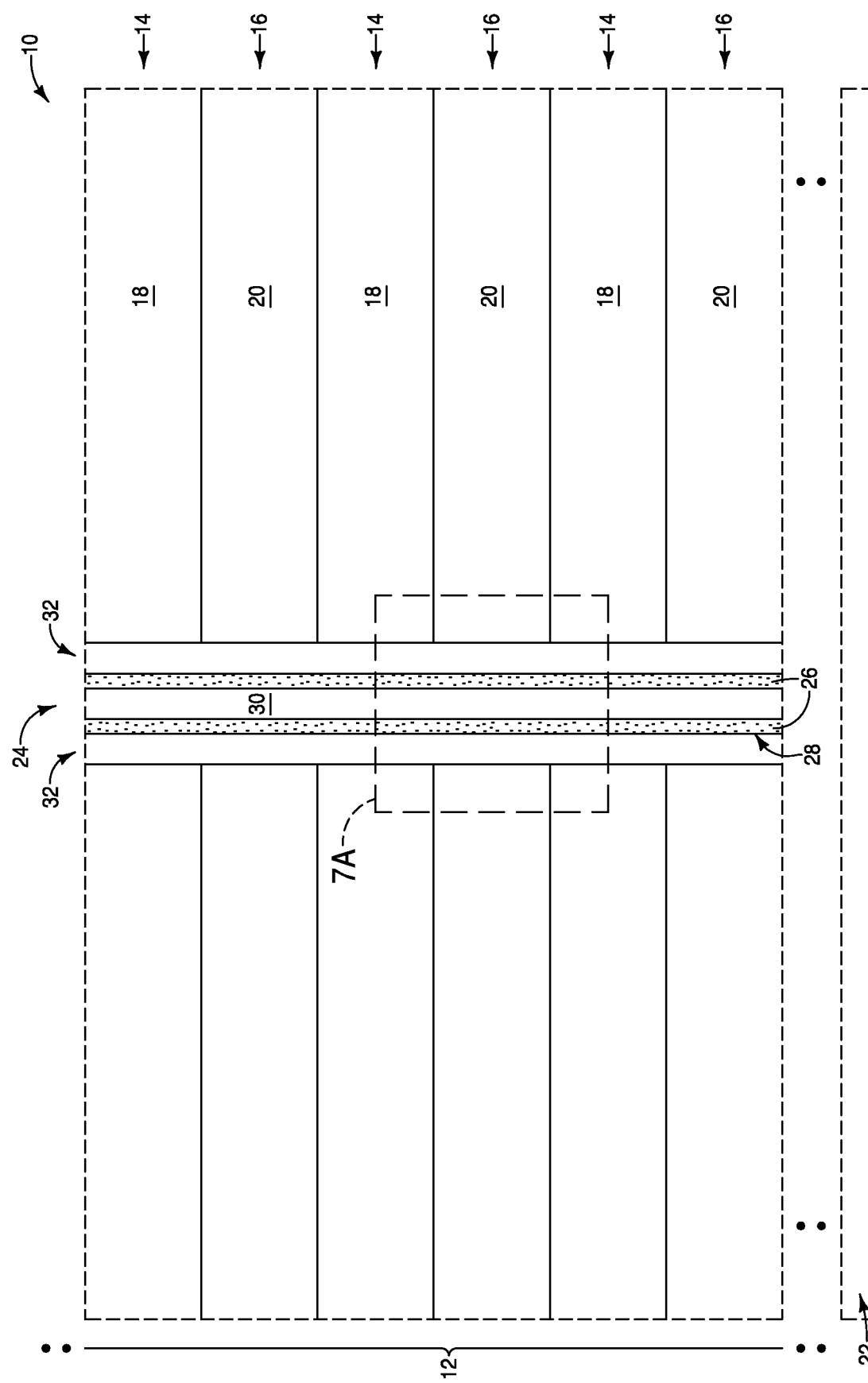
FIG. 7 is a diagrammatic cross-sectional side view of the region of the example integrated assembly of FIG. 5 at an example process stage following process stage of FIG. 6.

Referring to FIG. 7, materials are formed within the opening 24. One of the materials is a channel material 26. The channel material 26 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some example embodiments, the channel material 26 may comprise, consist essentially of, or consist of appropriately-doped silicon.

The channel material 26 is configured as a pillar 28 extending through the stack 12. The pillar is configured as an annular ring (shown in the top view of FIG. 15B). The annular ring surrounds insulative material 30 (e.g., silicon dioxide). The configuration of the channel material pillars 28 as annular rings may be considered to correspond to "hollow" channel configurations, with the dielectric material 30 being provided within the hollows of the channel material pillars. In other embodiments, the channel material pillars 28 may be configured as solid pillars, rather than being configured as the illustrated hollow pillars.

Figure 7A:
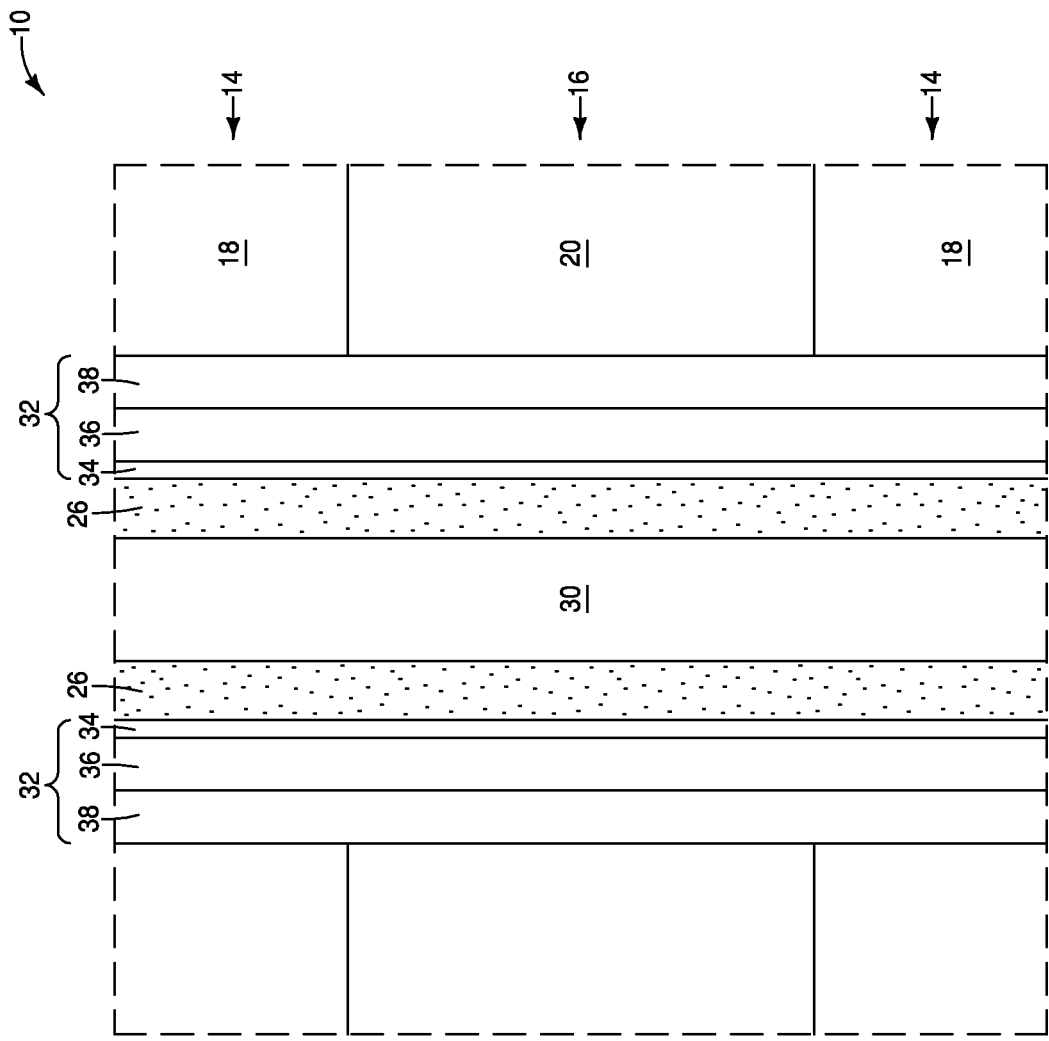
FIG. 7A is an enlarged view of a region 7A of FIG. 7.

The channel material pillars 28 are spaced from the levels 14 and 16 of the stack 12 by intervening regions 32. The regions 32 may comprise tunneling material, charge-storage material and charge-blocking material. FIG. 7A shows an enlarged view of a region of the assembly 10 of FIG. 7, and shows the tunneling material 34, charge-storage material 36 and charge-blocking material 38 within the intervening regions 32.

The tunneling material 34 (also referred to as gate-dielectric material, or simply as dielectric material) may comprise any suitable composition(s); and in some embodiments may comprise one or more of silicon dioxide, aluminum oxide, hafnium oxide, zirconium oxide, etc.

The charge-storage material 36 may comprise any suitable composition(s); and in some embodiments may comprise charge-trapping material; such as, for example, one or more of silicon nitride, silicon oxynitride, conductive nanodots, etc.

The charge-blocking material 38 may comprise any suitable composition(s); and in some embodiments may comprise one or more of silicon dioxide, aluminum oxide, hafnium oxide, zirconium oxide, etc.

Figure 8:
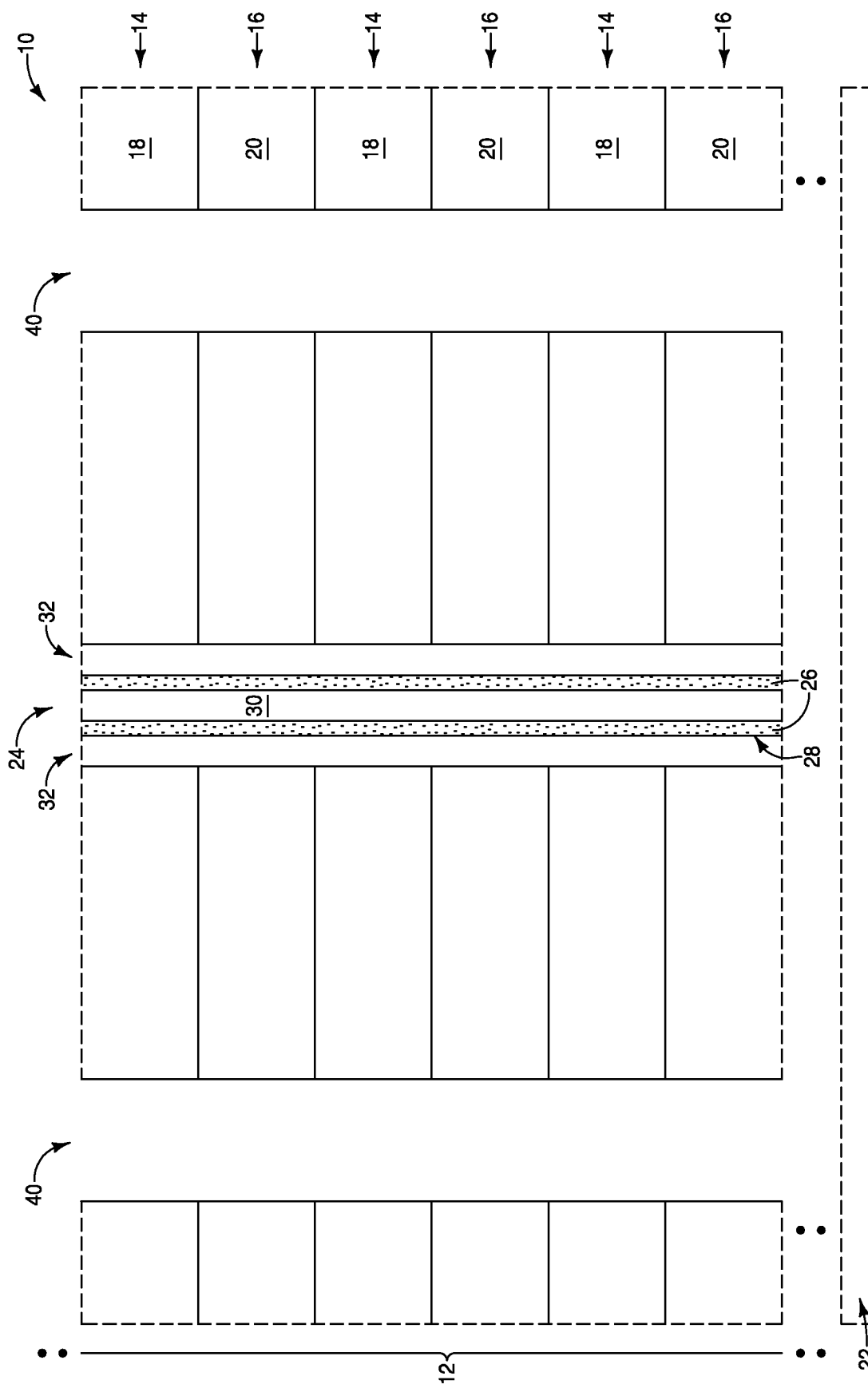
FIGS. 8-15 are diagrammatic cross-sectional side views of the region of the example integrated assembly of FIG. 5 at example sequential process stages following process stage of FIG. 7. The process stage of FIG. 15 shows a region of an example memory device.

Referring to FIG. 8, slits 40 are formed to extend through the stack 12. The slits 40 are laterally offset from the channel material 26.

Figure 9:
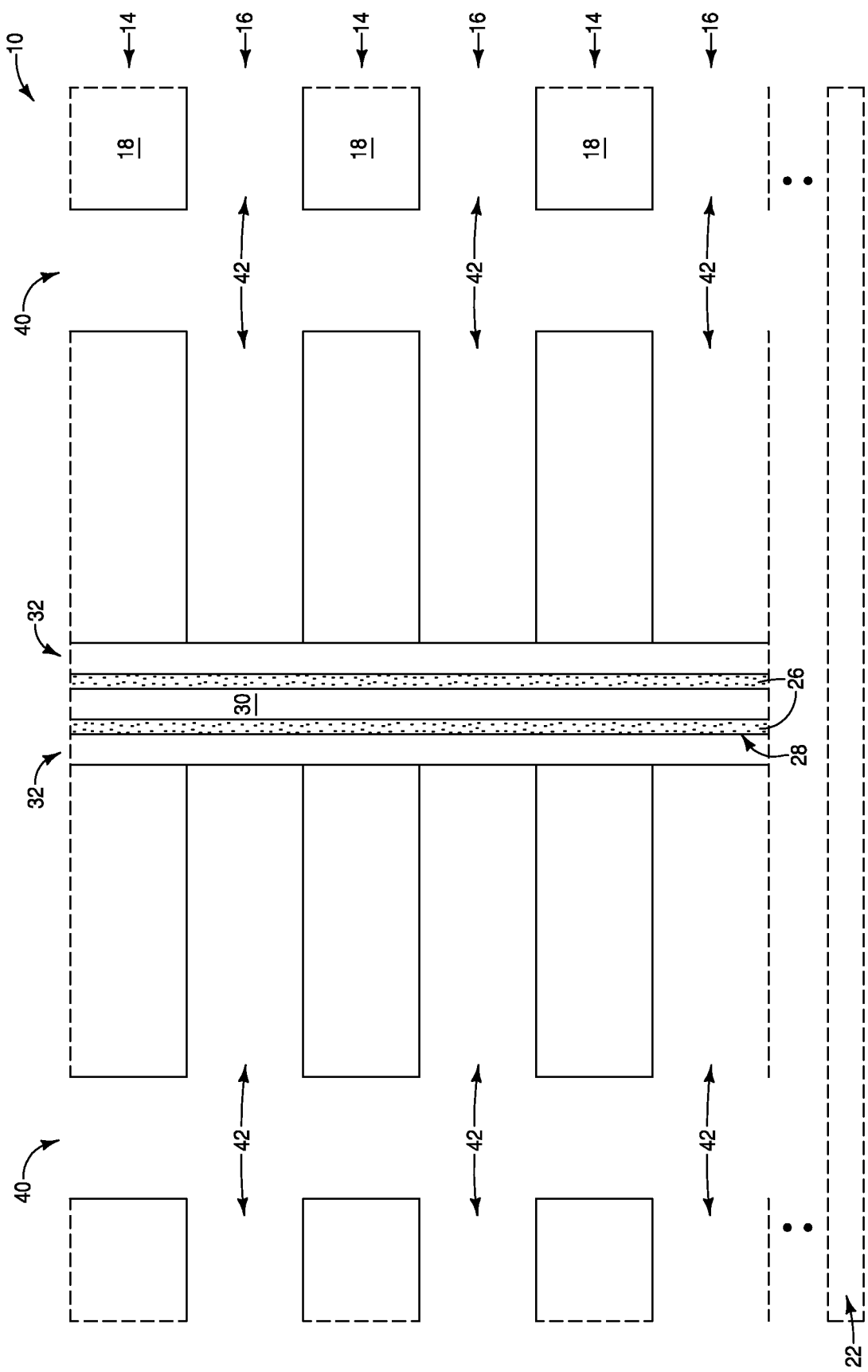

Referring to FIG. 9, the second material 20 (FIG. 8) is removed to leave voids 42 along the second levels 16. The second material 20 is removed selectively relative to the first material 18, and selectively relative to the charge-blocking material 38 (FIG. 7A) of the intervening regions 32. In some embodiments, the second material 20 comprises silicon nitride while the materials 18 and 38 comprise silicon dioxide. In such embodiments, the material 20 may be selectively removed utilizing, for example, phosphoric acid. For purposes of interpreting this disclosure and the claims that follow, a second material is considered to be selectively removed relative to a first material if the second material is removed faster than the first material, which may include, but which is not limited to, etches which are 100% selective for the second material relative to the first material.

Figure 10:
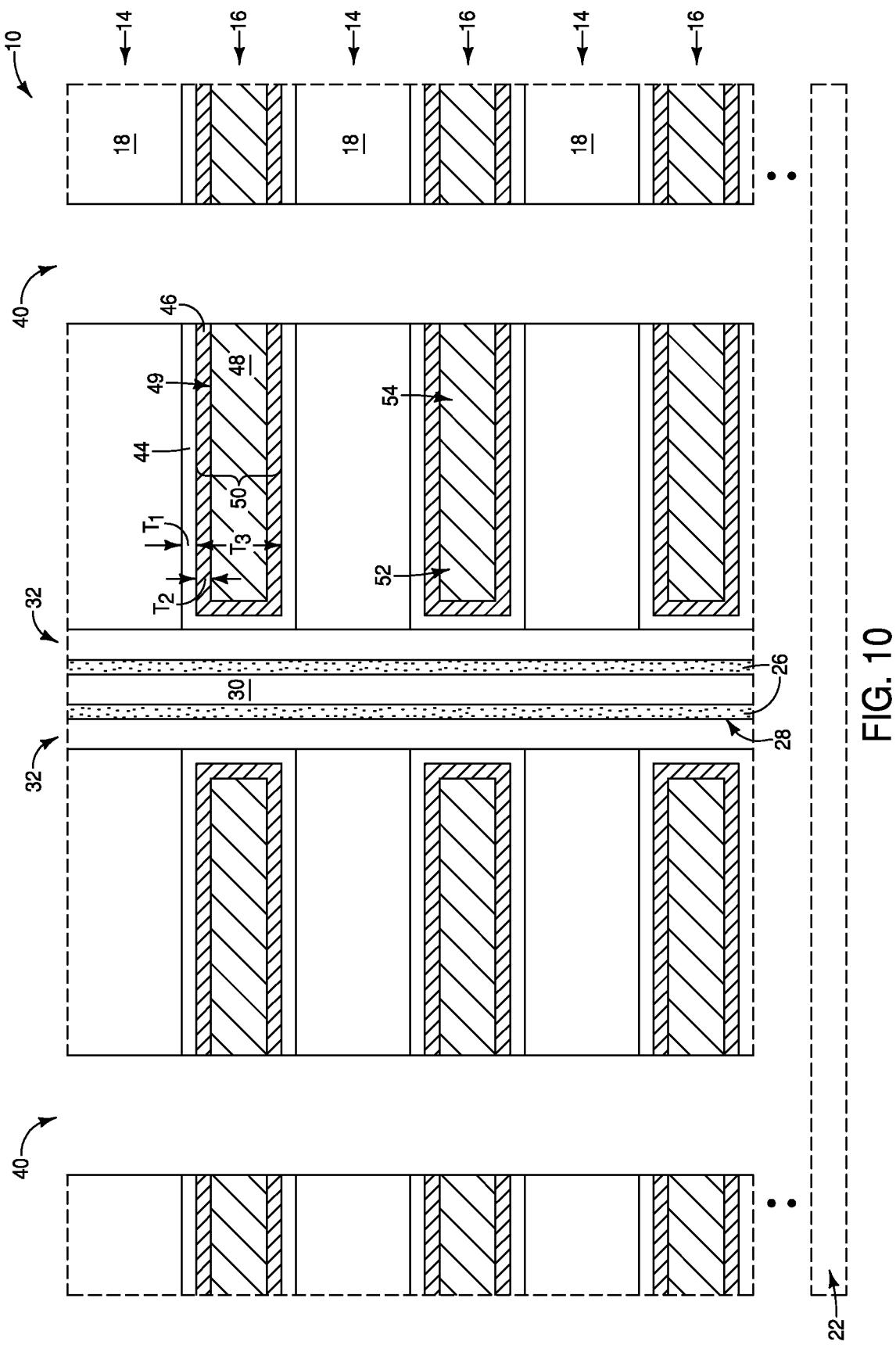

Referring to FIG. 10, dielectric material 44, and conductive materials 46 and 48, are formed within the voids 42 (FIG. 9).

In some embodiments, the dielectric material 44 may be a dielectric-barrier material; and may comprise one or more high-k compositions (e.g., aluminum oxide, hafnium oxide, zirconium oxide, etc.). The term "high-k composition" means a composition having a dielectric constant greater than the dielectric constant associated with silicon dioxide (i.e., greater than about 3.9). The dielectric material 44 may have a thickness $T_1$ within a range of, for example, from about 2 nm to about 40 nm. In some embodiments, the dielectric material 44 may be considered to be formed within the voids 42 (FIG. 9) as a first liner which narrows the voids.

The conductive material 46 may comprise a metal-containing composition (e.g., metal nitride, metal carbide, metal silicide, etc.); and in some embodiments may comprise titanium nitride. The conductive material 46 may have a thickness $T_2$ within a range of from about 2 nm to about 60 nm. In some embodiments, the conductive material 46 may be considered to be formed within the voids 42 as a second liner.

The conductive material 48 may comprise metal; and in some embodiments may consist essentially of, or consist of, one or more of tungsten, tantalum, titanium, cobalt, molybdenum, nickel, ruthenium, etc.

In some embodiments, the conductive material 48 may be considered to be a conductive core material, and the conductive material 46 may be considered to be a conductive liner material along an outer peripheral surface 49 of the core material. The liner material 46 comprises a different composition than the core material 48, and may or may not comprise a same metal as the core material. In some embodiments, the liner material 46 may be considered to comprise a first metal (e.g., titanium) and the core material 48 may be considered to comprise a second metal (e.g., tungsten).

In some embodiments, the conductive materials 46 and 48 may be considered together to be configured as conductive structures 50 which are formed within the voids 42 (FIG. 9). The conductive structures 50 have proximal regions 52 adjacent the channel material 26 (i.e., proximate to the channel material 26, or near to the channel material 26), and have distal regions 54 adjacent the slits 40.

The conductive structures 50 have a vertical thickness $T_3$ which may be, for example, within a range of from about 10 nm to about 400 nm.

Figure 11:
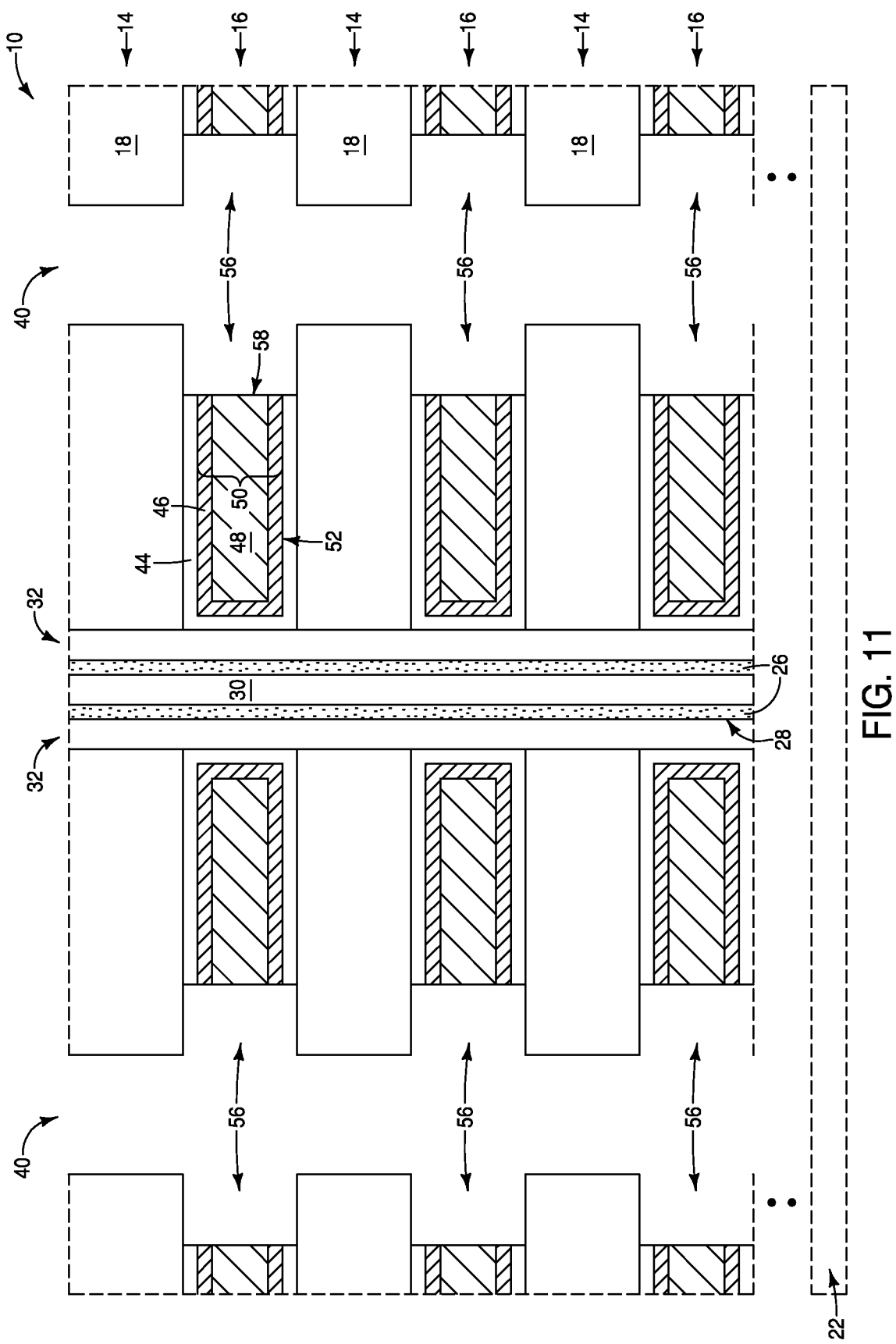

Referring to FIG. 11, the distal regions 54 (FIG. 10) of the conductive structures 50 are removed to form cavities 56 adjacent the proximal regions 52 of the conductive structures 50.

The distal regions of the conductive structures 50 may be removed with any suitable etch or combination of etches; and in some embodiments may be removed with one or more etches utilizing nitric acid ($HNO_3$). In the illustrated embodiment, the etching has recessed all of the materials 44, 46 and 48 about equally to form flat (straight) vertical surfaces 58 which extend along all of the materials 44, 46 and 48. In other embodiments, one or more of the materials 44, 46 and 48 may be recessed to an unequal amount relative to one or more of the other materials, as described in more detail below with reference to FIGS. 19-24.

Figure 12:
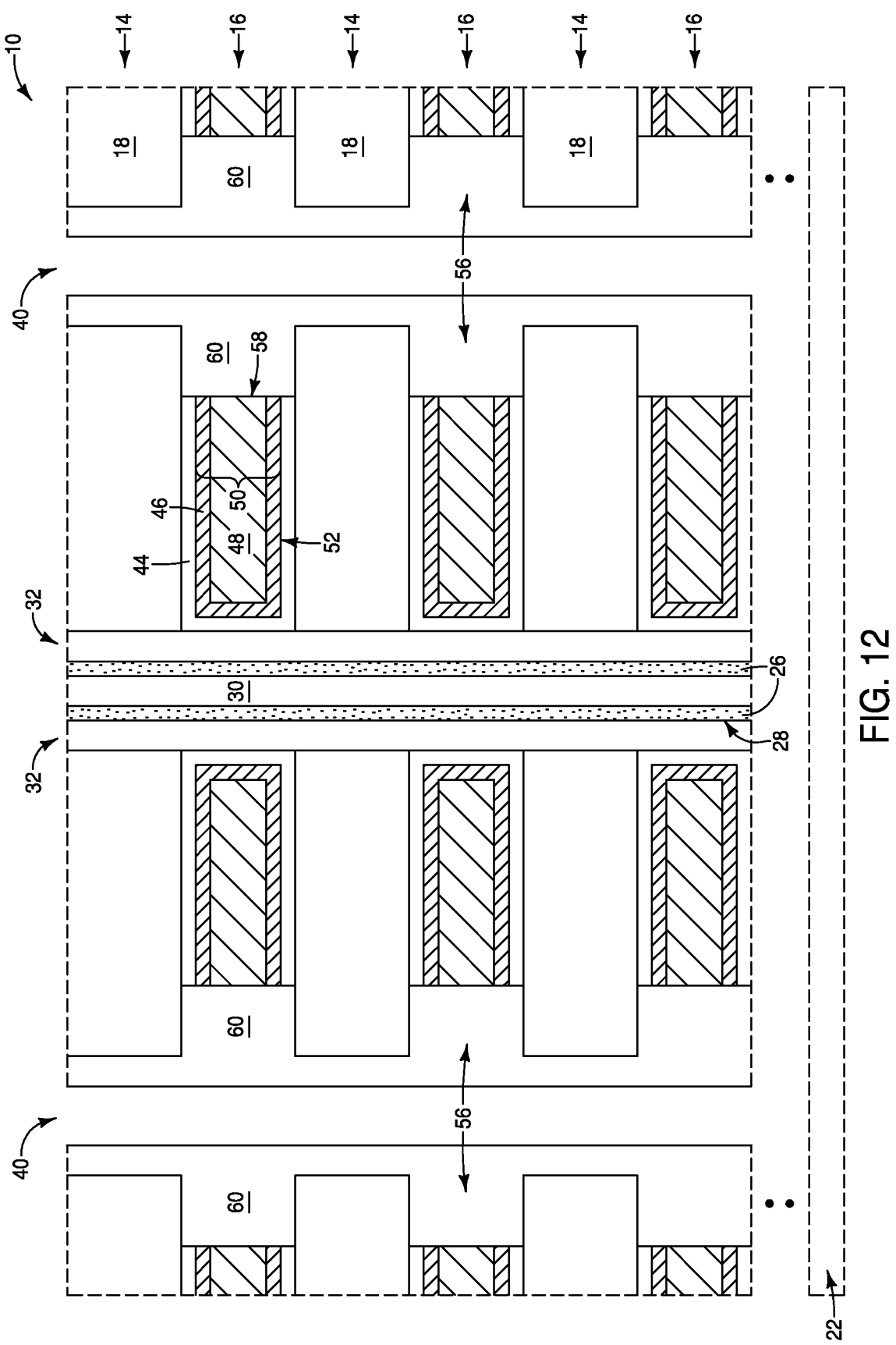

Referring to FIG. 12, semiconductor material 60 is formed within the slits 40, and fills the cavities 56. The semiconductor material 60 may comprise any suitable composition(s); and in some embodiments may comprise, consist essentially of, or consist of one or more of silicon, germanium, III/V semiconductor material (e.g., gallium phosphide), semiconductor oxide, etc. For instance, the semiconductor material 60 may comprise, consist essentially of, or consist of one or both of silicon and germanium. In some embodiments, the semiconductor material may be doped with one or both of carbon and boron to a concentration of at least about $10^{15}$ atoms/cm$^3$. In some embodiments, the dopant within the semiconductor material 60 may be present to a concentration of at least about $10^{18}$ atoms/cm$^3$, $10^{20}$ atoms/cm$^3$, $10^{22}$ atoms/cm$^3$, etc.

In the shown embodiment, the semiconductor material 60 only partially fills the slits 40. In other embodiments, the semiconductor material may completely fill the slits.

Figure 13:
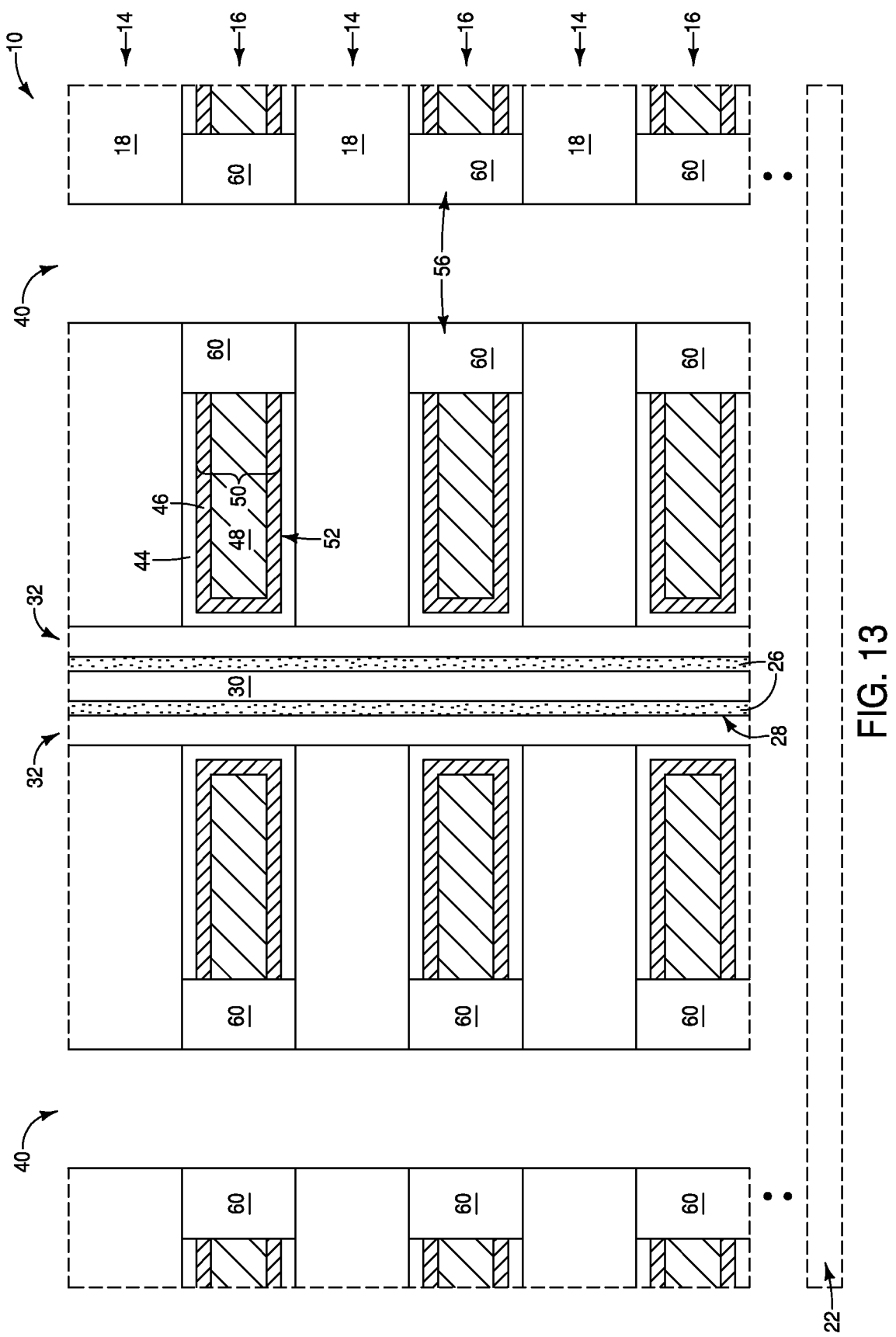

Referring to FIG. 13, the semiconductor material 60 is removed from within the slits 40 to leave the semiconductor material 60 only within the gaps 56.

Figure 14:
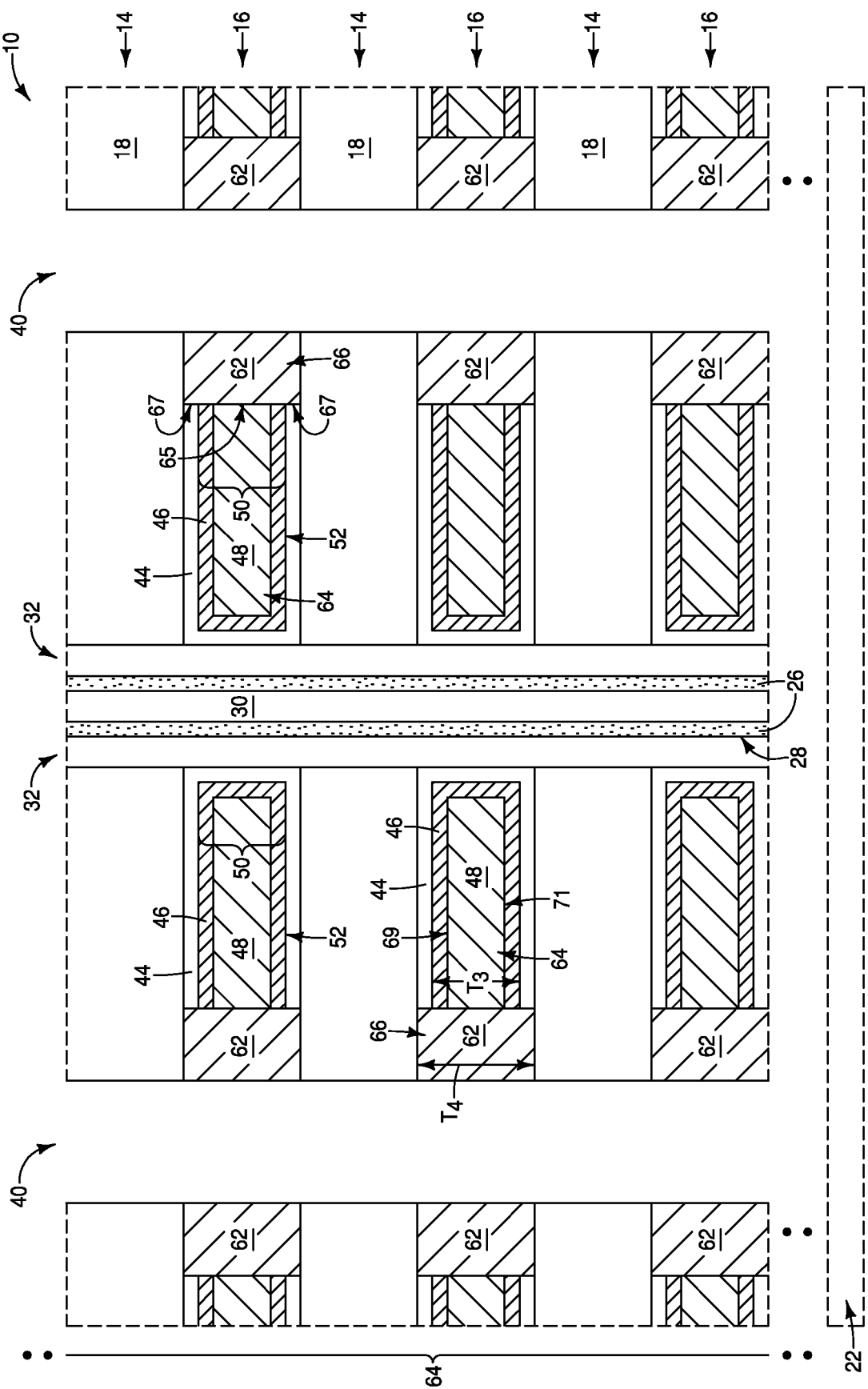

Referring to FIG. 14, the semiconductor material 60 is exposed to one or more suitable precursors to convert at least some of the semiconductor material to metal-containing material 62 (i.e., to replace at least some of the semiconductor material 60 with the metal-containing material 62). In some embodiments, the metal-containing material 62 may comprise, consist essentially of, or consist of one or more of cobalt, molybdenum, nickel, ruthenium, tantalum, titanium, tungsten, etc.

In some embodiments, the metal-containing material 62 may be formed utilizing one or more metal-halide precursors. For instance, in some embodiments the material 62 may comprise, consist essentially of, or consist of tungsten, and may be formed utilizing a precursor comprising a tungsten halide (e.g., tungsten fluoride, $WF_6$). The precursor may be utilized under any suitable reaction conditions; and in some embodiments may be utilized at a temperature of at least about 300° C., and at a pressure of about atmospheric pressure.

The material 62 may be pure metal, or may comprise one or more non-metal constituents in addition to the metal. In some embodiments, the material 62 may comprise one or more of boron, carbon, nitrogen, oxygen, germanium and silicon. Accordingly, one or more metals within the material 62 may be present as metal boride, metal carbide, metal nitride, metal germanide, metal silicide and/or metal oxide. The metal nitride may be formed by incorporating nitridizing (nitriding) species (e.g., $NH_3$) in combination with metal halide precursor during formation of the material 62. The metal oxide may be formed by incorporating oxidizing species (e.g., $O_2$ and/or $O_3$) in combination with metal halide precursor during formation of the material 62. The metal carbide may be formed by incorporating carbon-containing species (e.g., carbon halide) in combination with metal halide precursor during formation of the material 62. The metal boride may be formed by incorporating boron-containing species (e.g., $B_2H_6$) with metal halide precursor during formation of the material 62. The metal silicide may be formed by incorporating silicon-containing species (e.g., silane) in combination with metal halide precursor during formation of the material 62. Alternatively, or additionally, one or more of the non-metal constituents may be initially present as dopant within the semiconductor material 60 (FIG. 12). Additionally, or alternatively, one or more of the non-metal constituents may be remnant from the semiconductor material 60 (FIG. 12); e.g., one or both of silicon and germanium may be remnant from the semiconductor material 60.

The metal-containing material 62 is directly against the proximal regions 52 of the first conductive structures 50. In some embodiments, the configuration of FIG. 14 may be considered to comprise a vertical stack 64 of alternating first and second levels 14 and 16; with the first levels 14 being insulative levels and the second levels 16 being conductive levels. The conductive levels 16 may be considered to comprise first regions 64 corresponding to the conductive structures 50, and to comprise second regions 66 laterally adjacent to the first regions 64; with the second regions 66 corresponding to the metal-containing material 62. The first regions 64 join to the second regions 66 along interfaces 65. In the illustrated embodiment of FIG. 14, such interfaces 65 are substantially straight vertical interfaces which extend along the conductive liner material 46 and the conductive core material 48, as well as along the metal-containing material 62. The term "substantially straight" means straight to within reasonable tolerances of fabrication and measurement.

The metal-containing material 62 of the second regions 66 is also directly against surfaces of the dielectric-barrier material 44 (i.e., the high-k dielectric material); and may be considered to join to the dielectric-barrier material 44 along interfaces 67. The interfaces 67 may be referred to as second interfaces to distinguish them from the first interfaces 65. In the illustrated embodiment of FIG. 14, the second interfaces 67 are substantially straight vertical extensions from the first interfaces 65.

In some embodiments, the first regions 64 of the conductive levels 16 may be considered to comprise the conductive core material 48, and to comprise the conductive liner material 46 along upper and lower surfaces 69 and 71 of the conductive core material. The first regions 64 have a first vertical thickness $T_3$ (the vertical thickness $T_3$ described above with reference to FIG. 10), with such first vertical thickness extending across the conductive liner material 46 and the conductive core material 48. In the shown embodiment, the first regions 64 have two different conductive materials (e.g., materials 46 and 48) along the vertical thickness $T_3$. In other embodiments, the first regions 64 may have more than two different conductive materials along the vertical thickness $T_3$.

The second regions 66 of the conductive levels 16 have total vertical thicknesses $T_4$ which extend along the full vertical length of the second regions 66. In some embodiments, the vertical thicknesses $T_4$ of the second regions 66 may be referred to as second vertical thicknesses to distinguish them from the first vertical thicknesses $T_3$ of the first regions 64. The second regions 66 comprise a uniform composition along the total vertical thicknesses $T_4$. In the shown embodiment, the second vertical thickness $T_4$ is greater than (i.e., longer than) the first vertical thickness $T_3$. The length difference between the first and second vertical thicknesses $T_3$ and $T_4$ may be any suitable amount, and in some embodiments may be within a range of from about 4 nm to about 100 nm. In some embodiments, the first and second vertical thicknesses $T_3$ and $T_4$ may be about the same as one another (as described below with reference to FIG. 18); and accordingly in some embodiments the second vertical thickness $T_4$ may be referred to as being at least about as large as the first vertical thickness $T_3$.

The processing of FIGS. 11-14 removes the semiconductor material from within the slits 40 (FIG. 13) to leave the semiconductor material only within the cavities 56 as the semiconductor material is converted to the metal-containing material 62. In other embodiments, at least some of the semiconductor material may remain within the slits 40 to be converted to the metal-containing material 62, and then the excess metal-containing material 62 may be removed from within the slits 40 to leave the configuration of FIG. 14.

Figure 15:
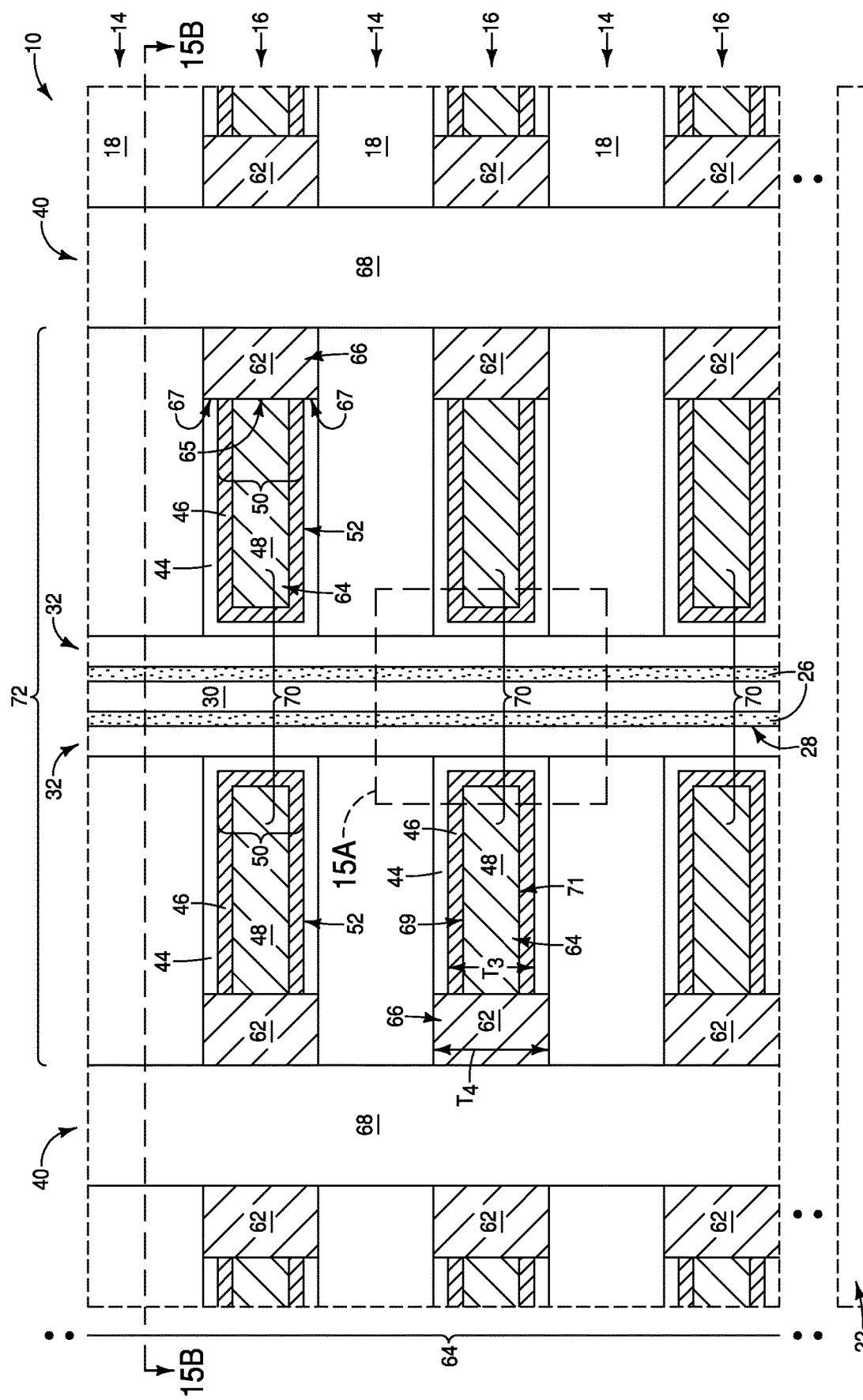

Referring to FIG. 15, the slits 40 are filled with insulative material 68 (e.g., silicon dioxide). In other embodiments, voids may remain within the slits 40.

The assembly 10 of FIG. 15 may be considered to be a memory device which comprises vertically-stacked memory cells 70. Each of the memory cells comprises segments of the first regions 64 of the conductive levels 16, and segments of the channel material 26. The segments of the conductive regions 64 may be considered to be control gate regions of the memory cells.

Figure 15A:
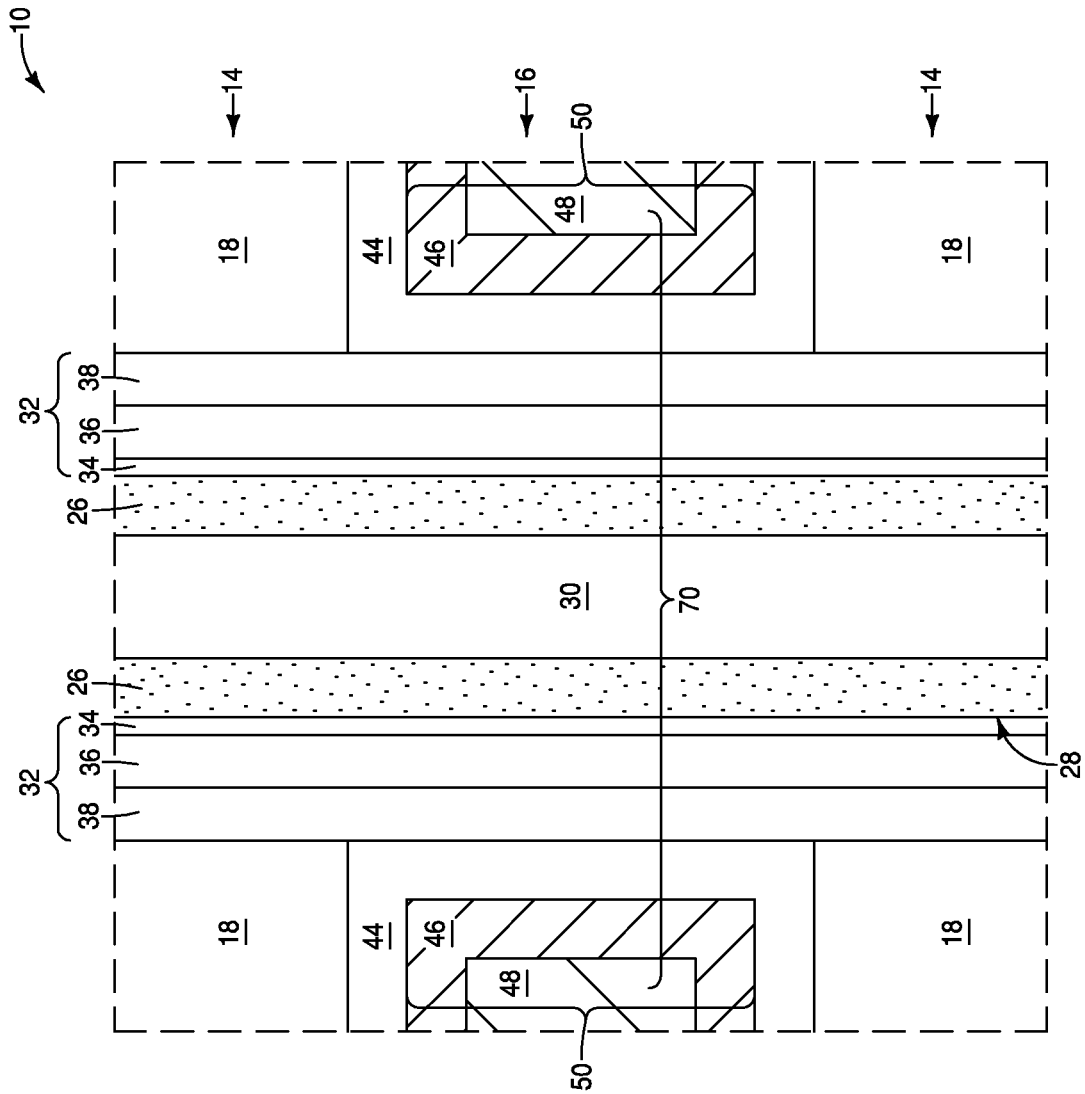
FIG. 15A is an enlarged view of a region 15A of FIG. 15.

FIG. 15A shows an enlarged view of a region of the memory device 10 of FIG. 15, and shows that each of the memory cells 70 may comprise segments of the tunneling material 34, charge-storage material 36, charge-blocking material 38, and dielectric-barrier material 44; in addition to the segments of the channel material 26 and the segments of the conductive materials 46 and 48 of the conductive structures 50.

The memory cells 70 may be considered to be representative of a large number of substantially identical memory cells which may be fabricated across a memory array (with the term "substantially identical" meaning identical to within reasonable tolerances of fabrication and measurement); such as, for example, NAND memory arrays analogous to those described above with reference to FIGS. 1-4.

The second regions 66 of the conductive levels 16 may be considered to be rails (routing structures, wordline regions, etc.) which couple the memory cells 70 with other circuitry (e.g., row decoder circuitry analogous to that described above with reference to FIG. 1).

FIG. 15B shows a top-down view of the configuration of FIG. 15 along the cross-section 15B-15B, and shows that the illustrated channel material pillar 28 may be one of many substantially identical channel material pillars provided between the slits 40. In some embodiments, a region 72 between the slits 40 may correspond to a block (or sub-block) of a NAND memory device. The channel material pillars 28 may be hexagonally-arranged within the region 72, and there may be any suitable number of the channel material pillars packed within such region.

The uniform metal-containing composition of the rails 66 may enable electrical signals to be more efficiently routed throughout the memory device 10 than can be achieved with conventional memory devices lacking the rails 66 having a uniform metal-containing composition.

The metal-containing composition of the rails 66 may be any suitable composition. In some embodiments, the core material 48 may consist of a metal (e.g., tungsten) and the rails 66 may comprise, consist essentially of, or consist of the same metal.

The rails 66 may comprise any suitable metal-containing composition(s). In some embodiments the rails 66 may comprise, consist essentially of, or consist of one or more of cobalt, molybdenum, nickel, ruthenium, tantalum, titanium, tungsten, etc. In some embodiments, the rails 66 may further comprise one or more of boron, carbon, nitrogen, oxygen, germanium and silicon.

The memory cells 70 may be operated as part of a NAND memory device. In operation, the charge-storage material 36 may be configured to store information in the memory cells 70. The value (with the term "value" representing one bit or multiple bits) of information stored in an individual memory cell 70 may be based on the amount of charge (e.g., the number of electrons) stored in a charge-storage region. The amount of charge within an individual charge-storage region may be controlled (e.g., increased or decreased) at least in part, based on the value of voltage applied to an associated control gate, and/or based on the value of voltage applied to an associated channel material.

The tunneling material 34 may be configured to allow desired tunneling (e.g., transportation) of charge (e.g., electrons) between the charge-storage material 36 and the channel material 26. The tunneling material may be configured (i.e., engineered) to achieve a selected criterion, such as, for example, but not limited to, an equivalent oxide thickness (EOT). The EOT quantifies the electrical properties of the tunneling material, (e.g., capacitance) in terms of a representative physical thickness. For example, EOT may be defined as the thickness of a theoretical silicon dioxide layer that would be required to have the same capacitance density as a given dielectric (e.g., tunneling material 34), ignoring leakage current and reliability considerations.

The charge-blocking material 38 may provide a mechanism to block charge from flowing from the charge-storage material to the control gate.

The dielectric barrier material 44 may be utilized to inhibit back-tunneling of electrons from the control gate toward the charge-storage material.

Figure 16:
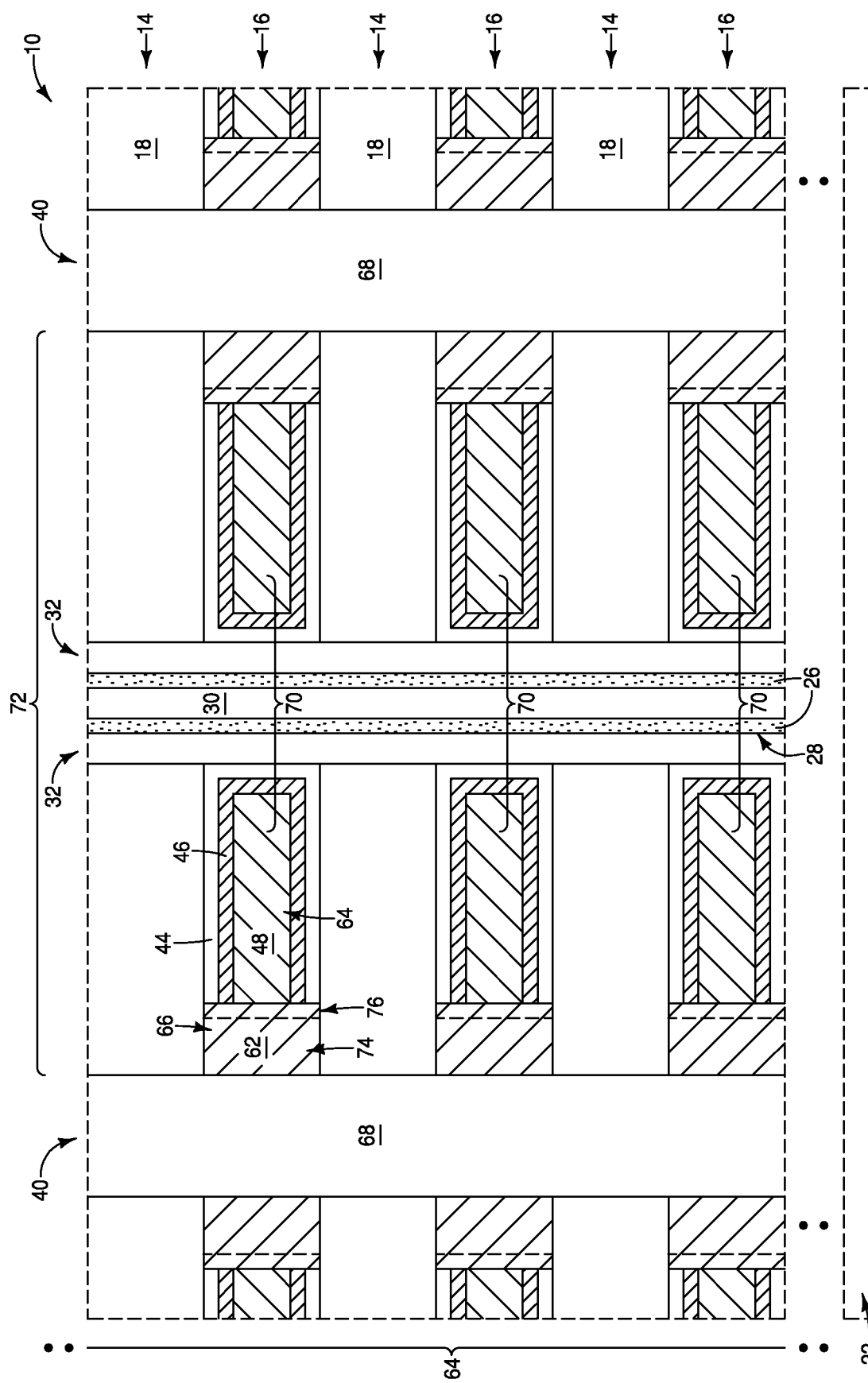
FIG. 16 is a diagrammatic cross-sectional side view of a region of an example memory device alternative to the memory device of FIG. 15.

The processing stage of FIG. 14 shows an entirety of the semiconductor material 60 (FIG. 13) converted to the metal-containing material 62 (i.e., replaced with the metal-containing material 62). In other embodiments, the conversion to the metal-containing material may be incomplete so that some non-fully-converted semiconductor material remains within the second regions 66 of the conductive levels 16. For instance, FIG. 16 shows an embodiment in which the regions 66 each comprise a first portion 74 laterally adjacent to a second portion 76. The first and second portions 74 and 76 may be compositionally different from one another. Specifically, the first portions 74 may be fully converted to the metal-containing material 62 (and in some embodiments may consist essentially of, or consist of, one or more of cobalt, molybdenum, nickel, ruthenium, tantalum, titanium, tungsten, etc.); and the second portions 76 may be less than fully converted to the metal-containing material, and may comprise metal in combination with one or more of silicon, germanium, carbon, nitrogen, oxygen and boron. In some embodiments, the first and second portions 74 and 76 may comprise a same metal as one another (e.g., tungsten), with the portions 74 consisting of such metal and the portion 76 comprising such metal in combination with one or more of silicon, germanium, carbon, nitrogen, oxygen and boron.

The boundary between the portions 74 and 76 may be an abrupt boundary or may be a gradient.

In the illustrated embodiment of FIG. 16, the second portion 76 is directly against the conductive materials 46 and 48 of the first regions 64 of the conductive levels 16. In some embodiments, the conductive material 48 is a metal-containing material consisting of the same metal that is present in the first portions 74. For instance, in some embodiments the first portions 74 of the regions 66, and the core material 48 of the regions 64, may both consist essentially of, or consist of, tungsten; while the second portions 76 of the regions 66 comprise tungsten together with one or both of silicon and germanium (i.e., comprise tungsten silicide and/or tungsten germanide).

The embodiment described above with reference to FIG. 11 shows all of the materials 44, 46 and 48 recessed about equally to form the cavities 56. In other embodiments, one or more of the materials 44, 46 and 48 may be recessed more than another of the materials 44, 46 and 48. It may be advantageous to tailor the relative amount of recessing of the materials 44, 46 and 48. Such tailoring may be accomplished, at least in part, by adjusting one or more of nitric acid concentration, temperature and duration of the etching utilized to form the cavities 56.

Figure 17:
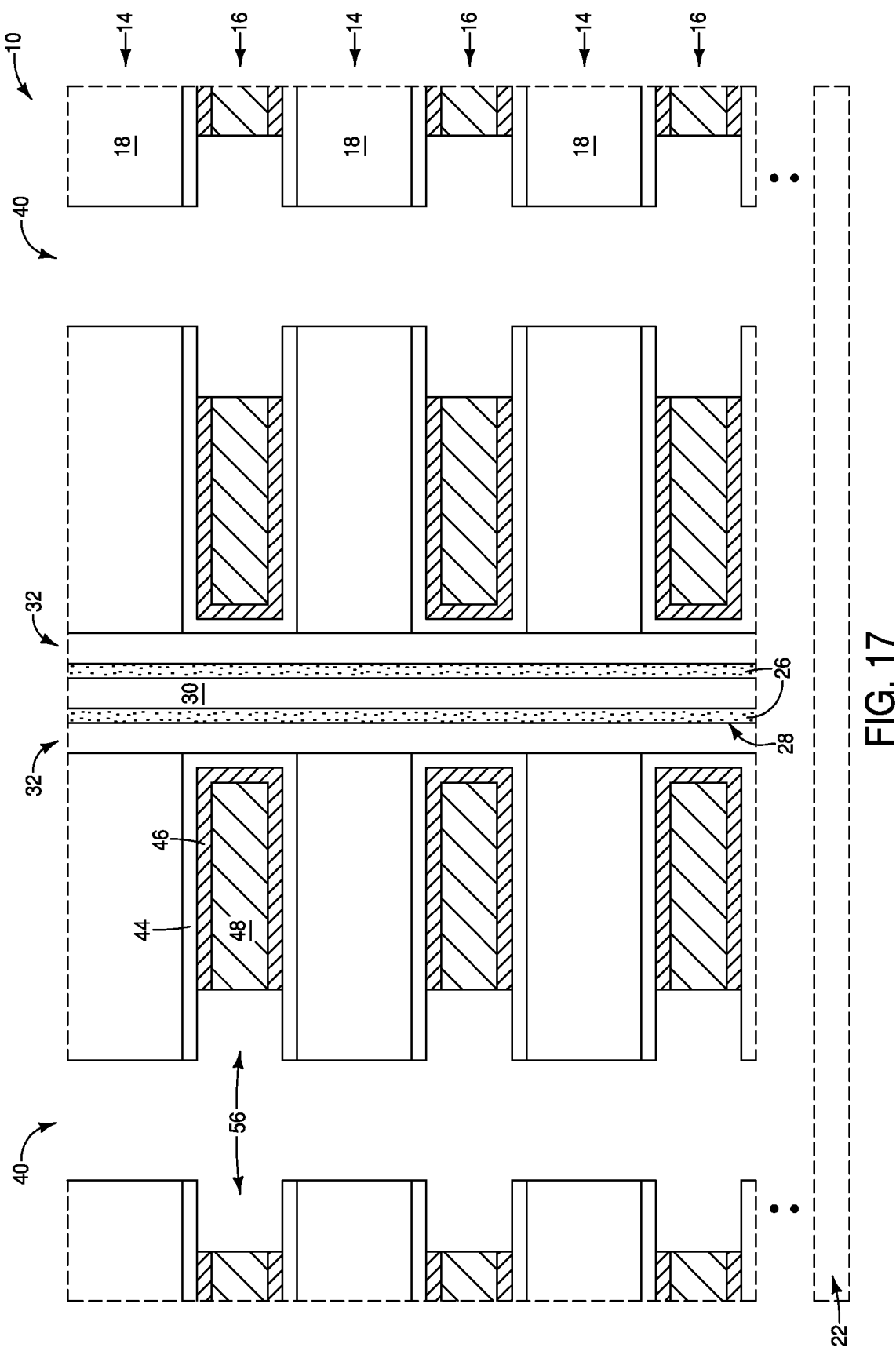
FIGS. 17 and 18 are diagrammatic cross-sectional side views of the example integrated assembly of FIG. 5 at example sequential process stages following the process stage of FIG. 10. The process stage of FIG. 17 may be alternative to that of FIG. 11. The process stage of FIG. 18 shows a region of another example memory device.

FIG. 17 shows an embodiment in which the conductive materials 46 and 48 are recessed, and in which the dielectric material 44 is not recessed during formation of the cavities 56.

Figure 18:
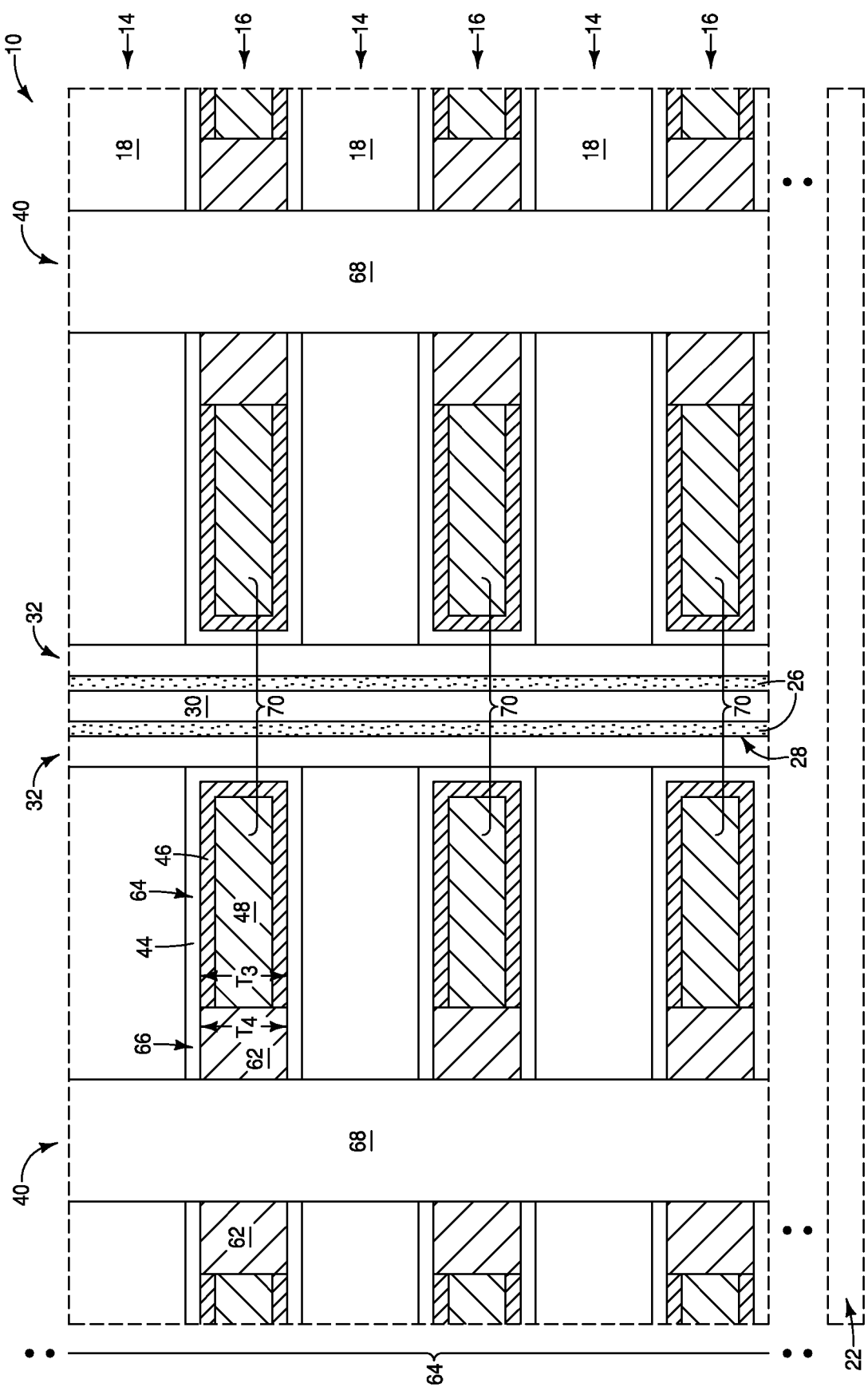

FIG. 18 shows a processing stage subsequent to that of FIG. 17, and after the conductive material 62 is formed within the cavities 56 of FIG. 17. The configuration of FIG. 18 is similar to that described above with reference to FIG. 15, except that the vertical thickness $T_4$ of the second regions 66 of the conductive levels 16 is about the same as the vertical thickness $T_3$ of the first regions 64 of the conductive levels 16.

The embodiment of FIG. 18 shows the entirety of the second regions 66 comprising the metal-containing material 62. In other embodiments, the second regions 66 may comprise two or more compositionally-different portions analogous to the portions 74 and 76 described above with reference to FIG. 16.

Figure 19:
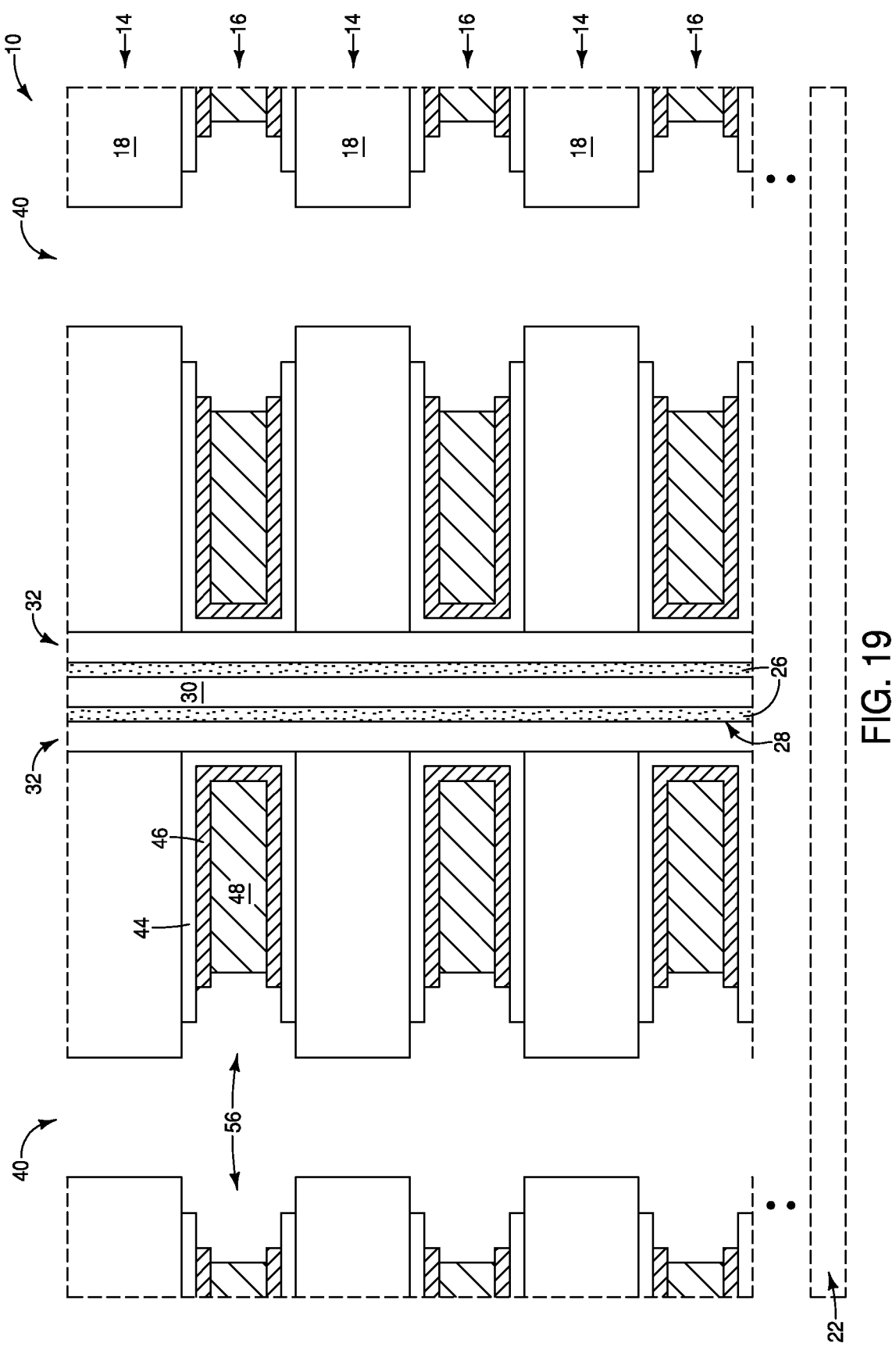
FIGS. 19-21 are diagrammatic cross-sectional side views of the example integrated assembly of FIG. 5 at example sequential process stages following the process stage of FIG. 10. The process stage of FIG. 19 may be alternative to that of FIG. 11. The process stages of FIGS. 20 and 21 show regions of example memory devices.

FIG. 19 shows another processing stage which may follow that of FIG. 10, and shows an embodiment in which the materials 44, 46 and 48 are all recessed to different levels relative to one another during the formation of the cavities 56.

Figure 20:
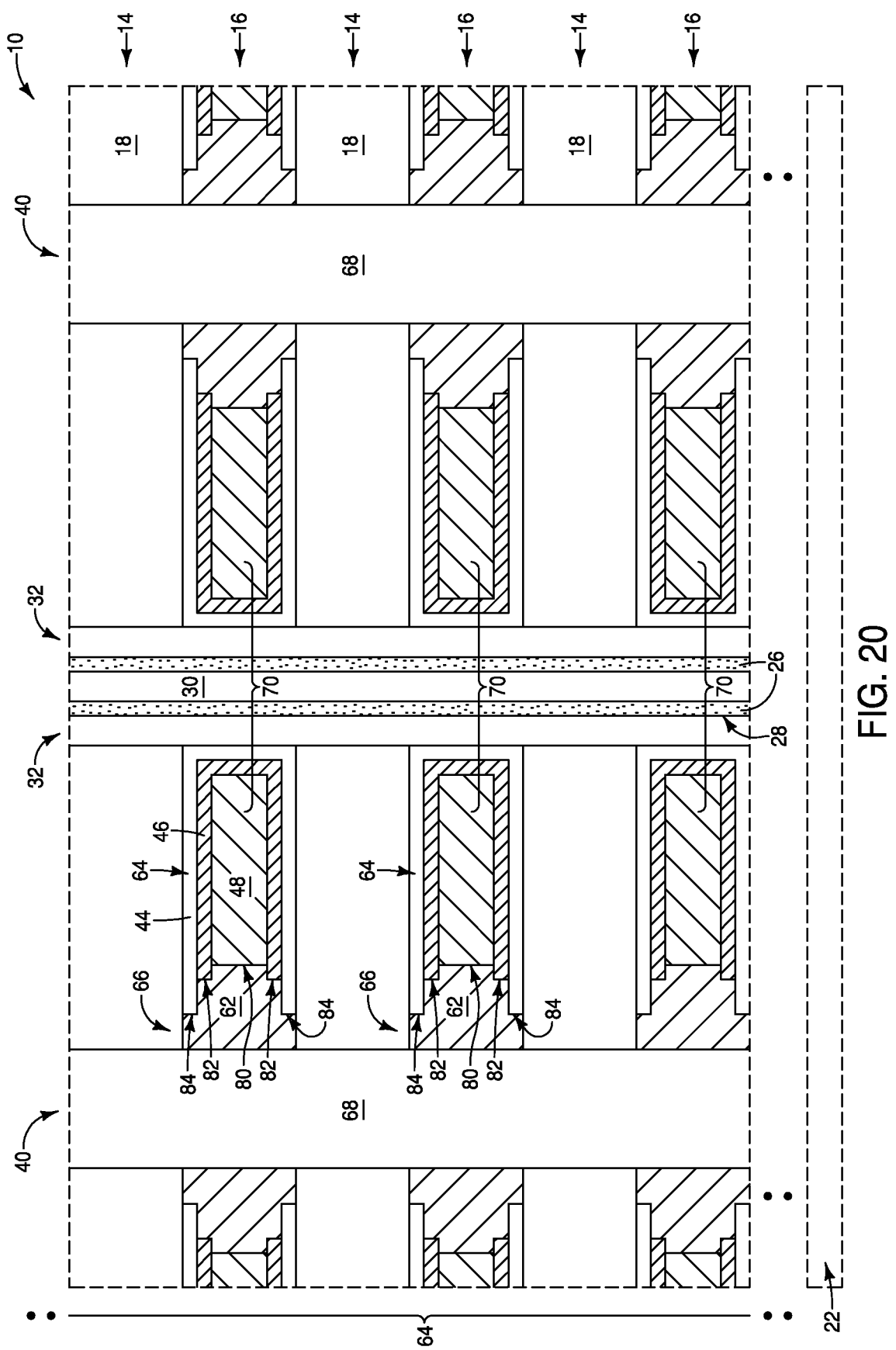

FIG. 20 shows a processing stage subsequent to that of FIG. 19, and after the conductive material 62 is formed within the cavities 56 of FIG. 19. The configuration of FIG. 20 is similar to that described above with reference to FIG. 15, except that conductive regions 64 do not join to the conductive regions 66 at straight vertical interfaces. Instead, the conductive core material 48 of the first regions 64 joins to the metal-containing material 62 of the second regions 66 along first vertically-extending interfaces 80, and the conductive liner material 46 of the first regions 64 joins to the metal-containing material 62 along second vertically-extending interfaces 82. The second vertically-extending interfaces 82 are horizontally offset relative to the first vertically-extending interfaces 80. In some embodiments, the first vertically-extending interfaces 80 may be considered to be along vertical surfaces of the conductive core material 48, and the second vertically-extending interfaces 82 may be considered to be along vertical surfaces of the conductive liner material 46.

The configuration of FIG. 20 also shows the dielectric-barrier material 44 joining to the metal-containing material 62 of the second regions 66 at third vertically-extending interfaces 84 which are horizontally offset relative to the first and second vertically-extending interfaces 80 and 82.

It may be advantageous to have the conductive liner material 46 extending beyond the conductive core material 48 (as achieved in the embodiment of FIG. 20) to improve adhesion to the rail material 62 in some applications.

Figure 21:
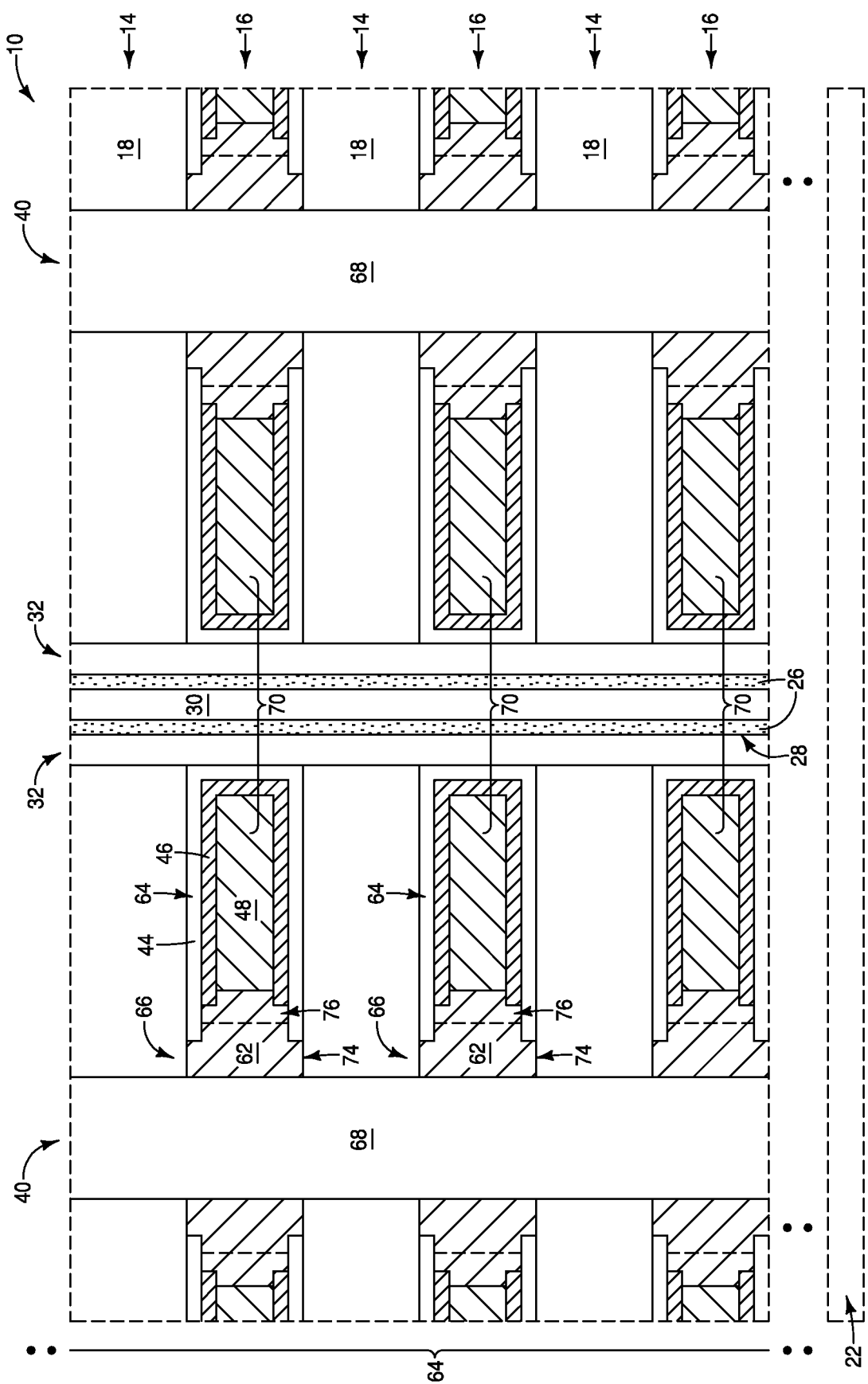

FIG. 21 shows a configuration similar to that of FIG. 20, but shows the second regions 66 comprising the two compositionally-different portions 74 and 76 described above with reference to FIG. 16.

Figure 22:
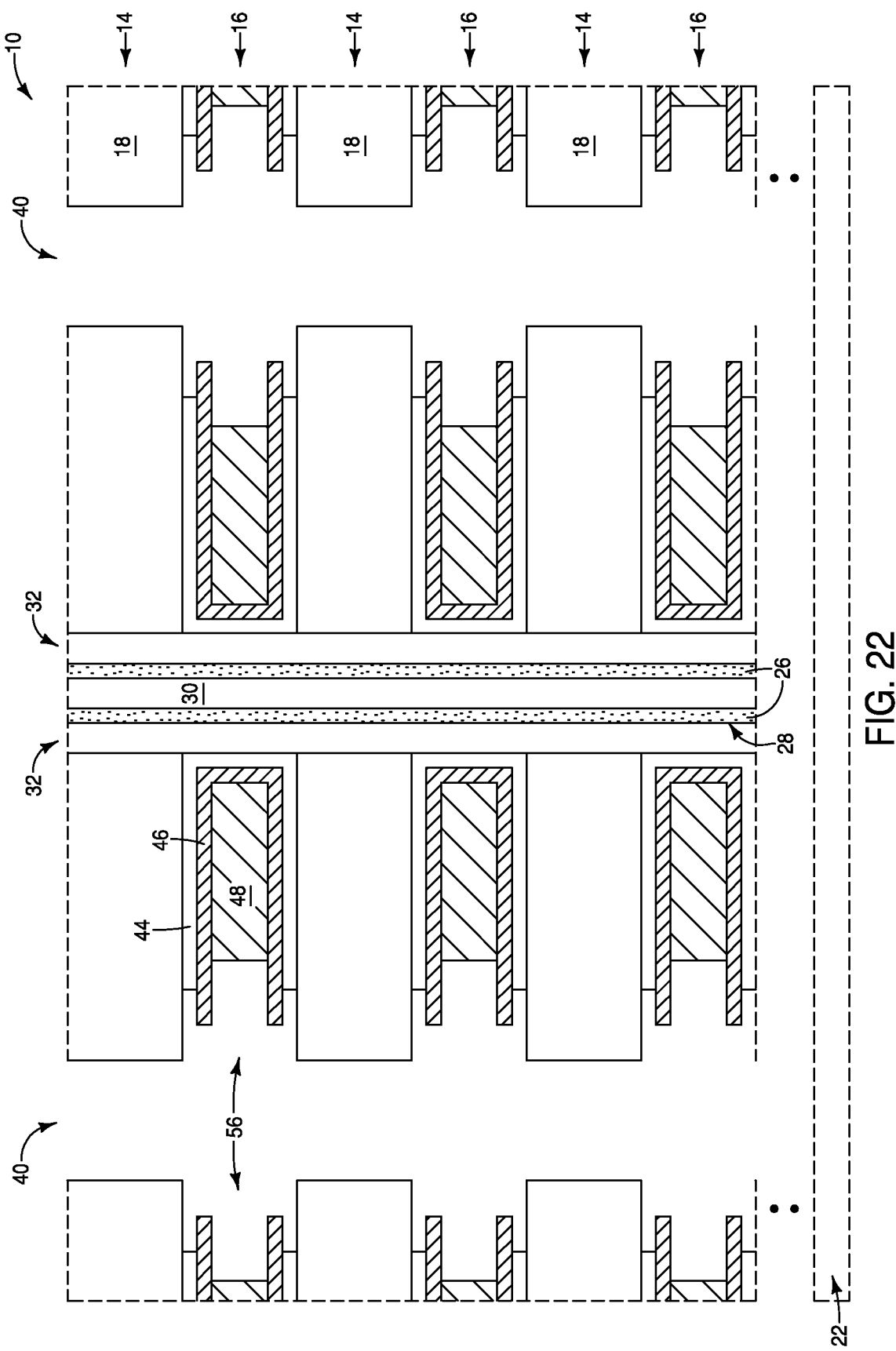
FIGS. 22-24 are diagrammatic cross-sectional side views of the example integrated assembly of FIG. 5 at example sequential process stages following the process stage of FIG. 10. The process stage of FIG. 22 may be alternative to that of FIG. 11. The process stages of FIGS. 23 and 24 show regions of example memory devices.

FIG. 22 shows another processing stage which may follow that of FIG. 10, and shows another embodiment in which the materials 44, 46 and 48 are all recessed to different levels relative to one another during the formation of the cavities 56.

Figure 23:
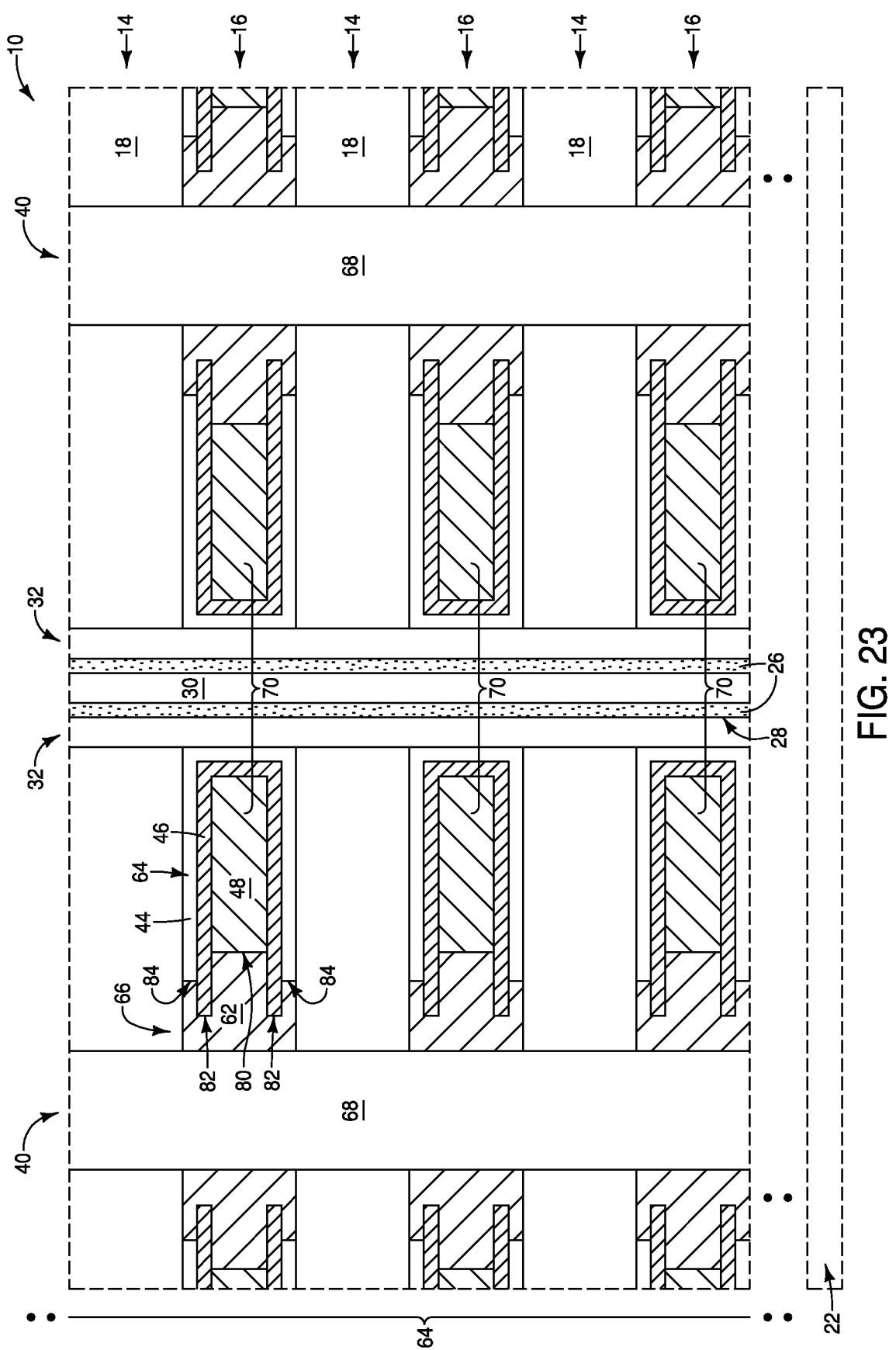

FIG. 23 shows a processing stage subsequent to that of FIG. 22, and after the conductive material 62 is formed within the cavities 56 of FIG. 22. The configuration of FIG. 23 is similar to that described above with reference to FIG. 15, except that conductive regions 64 do not join to the conductive regions 66 at straight vertical interfaces. Instead, the conductive core material 48 of the first regions 64 joins to the metal-containing material 62 of the second regions 66 along first vertically-extending interfaces 80, and the conductive liner material 46 of the first regions 64 joins to the metal-containing material 62 along second vertically-extending interfaces 82. The second vertically-extending interfaces 82 are horizontally offset relative to the first vertically-extending interfaces 80. In some embodiments, the first vertically-extending interfaces 80 may be considered to be along vertical surfaces of the conductive core material 48, and the second vertically-extending interfaces 82 may be considered to be along vertical surfaces of the conductive liner material 46.

The configuration of FIG. 23 also shows the dielectric-barrier material 44 joining to the metal-containing material 62 of the second regions 66 at third vertically-extending interfaces 84 which are horizontally offset relative to the first and second vertically-extending interfaces 80 and 82.

It may be advantageous to have the conductive liner material 46 extending beyond the conductive core material 48 (as achieved in the embodiment of FIG. 23) to improve adhesion to the rail material 62 in some applications.

Figure 24:
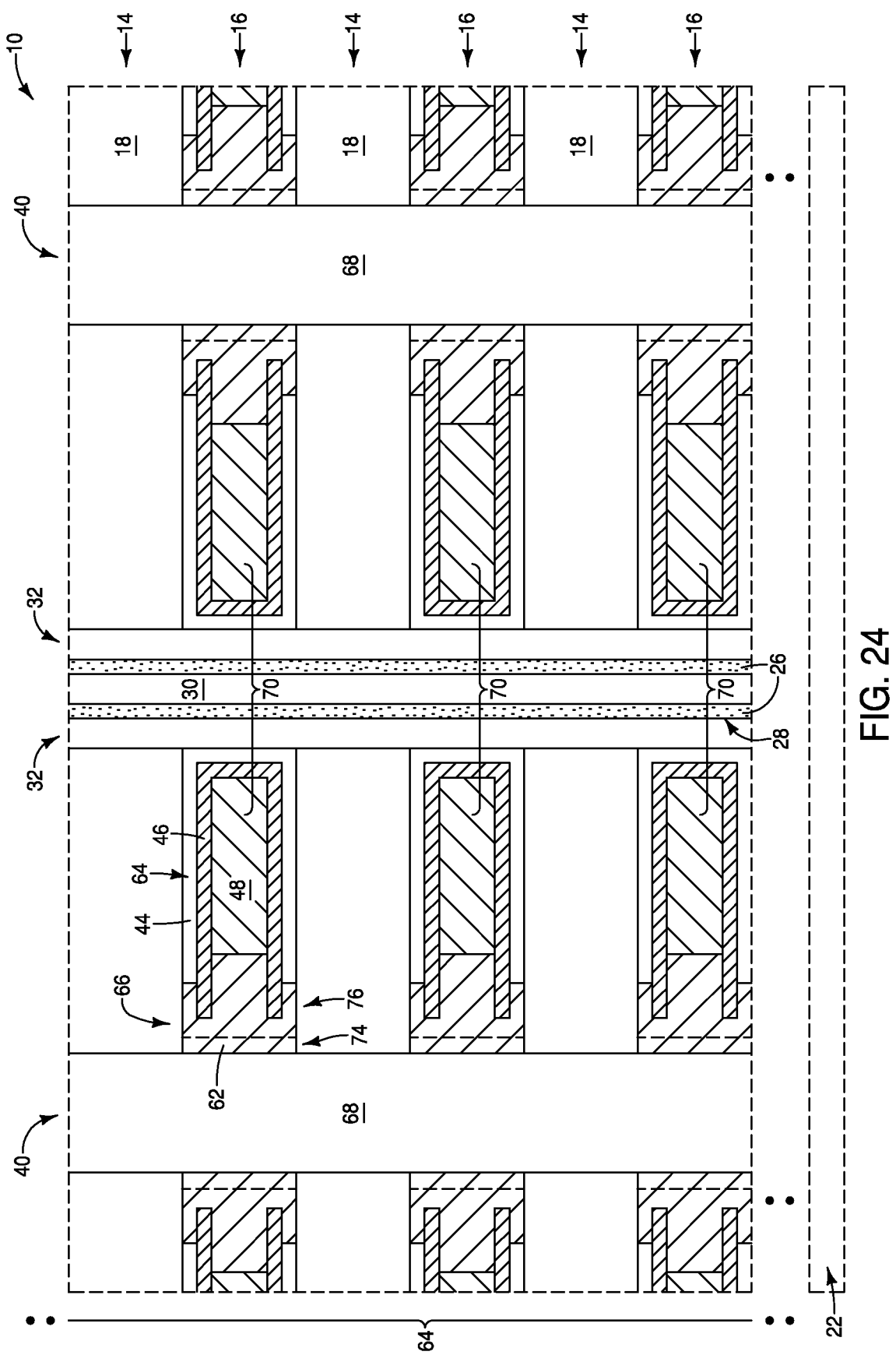

FIG. 24 shows a configuration similar to that of FIG. 23, but shows the second regions 66 comprising the two compositionally-different portions 74 and 76 described above with reference to FIG. 16.

The methods described above form the conductive material 62 of the conductive rails 66 by first depositing semiconductor material 60 within the cavities 56 (e.g., the processing of FIGS. 11-13), and then converting the semiconductor material to the material 62 (e.g., the processing of FIG. 14); which may effectively result in replacing the semiconductor material 60 with the metal-containing material 62. In other embodiments, the metal-containing material 62 may be formed within the cavities 56 with other suitable processing, including, for example, direct deposition of the metal-containing material 62, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a vertical stack of alternating insulative levels and conductive levels. The conductive levels have first regions, and have second regions laterally adjacent the first regions. The first regions include a conductive core material and include a conductive liner material along upper and lower surfaces of the conductive core material. The conductive liner material is compositionally different from the conductive core material. The first regions each have a first vertical thickness which extends across the conductive liner material and the conductive core material. The second regions each include a conductive rail with a total vertical thickness at least about the same as the first vertical thickness. Each of the conductive rails has a uniform composition along its total vertical thickness.

Some embodiments include a memory device having a vertical stack of alternating insulative levels and conductive levels. The conductive levels include first regions and second regions laterally adjacent the first regions. The first regions have a first vertical thickness and at least two different metal-containing materials along the first vertical thickness. The second regions have a second vertical thickness and only a single metal-containing material along the second vertical thickness. Dielectric-barrier material is laterally adjacent the first regions. Charge-blocking material is laterally adjacent the dielectric-barrier material. Charge-storage material is laterally adjacent the charge-blocking material. Dielectric material is laterally adjacent the charge storage material. Channel material is laterally adjacent the dielectric material.

Some embodiments include a method of forming an integrated assembly. A vertical stack of alternating first and second levels is formed. The first levels comprise first material and the second levels comprise second material. An opening is formed to extend through the stack. Channel material is formed within the opening. Slits are formed to extend through the stack, with the slits being laterally offset from the channel material. After the slits are formed, the second material is removed to leave voids. First conductive structures are formed within the voids. The first conductive structures have proximal regions adjacent the channel material and have distal regions adjacent the slits. The distal regions are removed to form cavities adjacent the proximal regions. Second conductive structures are formed within the cavities and directly against the proximal regions of the first conductive structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
    forming a vertical stack of alternating first and second levels; the first levels comprising first material and the second levels comprising second material;
    forming an opening to extend through the stack;
    forming channel material within the opening;
    forming slits to extend through the stack, with the slits being laterally offset from the channel material;
    after forming the slits, removing the second material to leave voids;
    forming first conductive structures within the voids; the first conductive structures having proximal regions adjacent the channel material and having distal regions adjacent the slits;
    removing the distal regions to form cavities adjacent the proximal regions;
    forming second conductive structures within the cavities and directly against the proximal regions of the first conductive structures; and
    forming a high-k dielectric material along upper and lower surfaces of the proximal regions of the first conductive structures, the high-k material being absent from upper and lower surfaces of the second conductive structures, the second conductive structure having a vertical thickness equal to a combined thickness of the first conductive structure and the high-k dielectric material along the upper and lower surfaces of the first conductive structure.

2. The method of claim 1 wherein each of the first conductive structures comprises a conductive liner and a conductive core material; with the conductive liner being along an outer peripheral surface of the conductive core material.

3. The method of claim 1 wherein dielectric-barrier material is formed within the voids to narrow the voids prior to the forming of the first conductive structures within the voids; and wherein the forming of the cavities comprises recessing the dielectric barrier material.

4. The method of claim 1 further comprising forming charge-blocking material, charge-storage material and dielectric material within the opening and adjacent to the channel material.

5. A method of forming an integrated assembly, comprising:
    forming a vertical stack of alternating first and second levels; the first levels comprising first material and the second levels comprising second material;
    forming an opening to extend through the stack;
    forming channel material within the opening;
    forming slits to extend through the stack, with the slits being laterally offset from the channel material;
    after forming the slits, removing the second material to leave voids;
    forming first conductive structures within the voids; the first conductive structures having proximal regions adjacent the channel material and having distal regions adjacent the slits;
    removing the distal regions to form cavities adjacent the proximal regions; and
    forming second conductive structures within the cavities and directly against the proximal regions of the first conductive structures; wherein the forming of the second conductive structures comprises:
        forming semiconductor material within the cavities; and
        replacing at least some of the semiconductor material with metal-containing material.

6. The method of claim 5 wherein the semiconductor material is doped with one or both of carbon and boron.

7. The method of claim 5 wherein the replacing comprises exposure of the semiconductor material to a precursor comprising a metal halide.

8. The method of claim 7 wherein the metal halide is a metal fluoride.

9. The method of claim 5 wherein the metal-containing material comprises one or more of cobalt, molybdenum, nickel, ruthenium, tantalum, titanium and tungsten.

10. The method of claim 9 wherein the semiconductor material comprises one or both of germanium and silicon; and wherein only some of the semiconductor material is replaced with the metal-containing material while portions of the semiconductor material directly adjacent to the proximal regions of the first conductive structures are converted to one or both of metal silicide and metal germanide.

11. A method of forming an integrated assembly, comprising:
    forming conductive levels that alternate with insulative levels to form a stack; the forming the conductive levels comprising:
        forming first regions of the conductive levels by forming a conductive core material and forming a conductive liner material along upper and lower surfaces of the conductive core material; the conductive liner material being compositionally different from the conductive core material; and
        forming second regions of the conductive levels laterally adjacent the first regions, the second regions comprising a conductive rail having at least two portions laterally offset relative to one another, with one of the at least two portions having a first uniform composition along its total vertical thickness, and with another of the at least two portions having a second uniform composition, different from the first uniform composition, along its total vertical thickness.

12. The method of claim 11 further comprising forming channel material passing through the vertical stack.

13. The method of claim 12 further comprising forming memory cells which individually include segments of the first regions and segments of the channel material.

14. The method of claim 13 further comprising forming a charge-blocking material, a charge-storage material, and a dielectric material between the segments of the first regions and the segments of the channel material.

15. The method of claim 11 wherein the conductive rails of the second regions are formed directly against the conductive core material and the conductive liner material of the first regions.

16. The method of claim 11 wherein interfaces between the first regions of the conductive levels and the second regions of the conductive levels are substantially straight vertical interfaces extending along the conductive liner material and the conductive core material.

17. The method of claim 11 wherein interfaces between the first regions of the conductive levels and the second regions of the conductive levels include first vertical surfaces extending along the conductive core material and second vertical surfaces extending along the conductive liner material; and wherein the second vertical surfaces are horizontally offset relative to the first vertical surfaces.

* * * * *